United States Patent
Nammi et al.

(10) Patent No.: US 10,637,694 B1
(45) Date of Patent: Apr. 28, 2020

(54) REDUCTION AND/OR MITIGATION OF SPATIAL EMISSIONS IN MULTI-ANTENNA WIRELESS COMMUNICATION SYSTEMS FOR ADVANCED NETWORKS

(71) Applicant: AT&T Intellectual Property I, L.P., Atlanta, GA (US)

(72) Inventors: SaiRamesh Nammi, Austin, TX (US); Arunabha Ghosh, Austin, TX (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 16/229,779

(22) Filed: Dec. 21, 2018

(51) Int. Cl.
*H04L 25/03* (2006.01)
*H04L 25/02* (2006.01)
(Continued)

(52) U.S. Cl.
CPC ..... *H04L 25/03343* (2013.01); *H03F 1/3282* (2013.01); *H03F 3/189* (2013.01);
(Continued)

(58) Field of Classification Search
CPC ........... H04L 25/03343; H04L 25/0256; H04L 25/49; H03F 1/3282; H03F 3/189; H03F 1/3247; H04W 52/16
See application file for complete search history.

(56) References Cited

U.S. PATENT DOCUMENTS 6,157,343 A * 12/2000 Andersson ............. H01Q 3/267
342/174
8,873,677 B1 10/2014 Loh et al.
(Continued)

FOREIGN PATENT DOCUMENTS

| WO | 2016151518 A1 | 9/2016 |
| WO | 2017/091119 A1 | 6/2017 |
| WO | 2018219466 A1 | 12/2018 |

OTHER PUBLICATIONS

Mollen et al., "Out-of-Band Radiation from Large Antenna Arrays", IEEE Communications Magazine, 2018, vol. 56, No. 4, pp. 196-203, IEEE, 15 pages.
(Continued)

*Primary Examiner* — Freshteh N Aghdam
(74) *Attorney, Agent, or Firm* — Amin, Turocy & Watson, LLP

(57) ABSTRACT

Facilitating the reduction and/or mitigation of spatial emissions in a multi antenna wireless communications system is provided herein. A system can comprise a memory that stores executable instructions that, when executed by a processor, facilitate performance of operations that can comprise applying a first signal linearization to a first output signal of a first power amplifier based on a determination that an adjacent channel leakage ratio of the first output signal of the first power amplifier fails to satisfy a defined output value. The operations can also comprise applying a second signal linearization to a group of output signals of a group of power amplifiers for a defined azimuth direction associated with channel frequencies of the group of output signals and applying a third signal linearization to the group of output signals for a defined elevation direction associated with the channel frequencies of the group of output signals.

20 Claims, 18 Drawing Sheets

(51) Int. Cl.
*H04L 25/49* (2006.01)
*H03F 1/32* (2006.01)
*H03F 3/189* (2006.01)
*H04W 52/16* (2009.01)

(52) U.S. Cl.
CPC .......... *H04L 25/0256* (2013.01); *H04L 25/49* (2013.01); *H04W 52/16* (2013.01); *H03F 1/3247* (2013.01)

(56) References Cited

U.S. PATENT DOCUMENTS

| | | | |
|---|---|---|---|
| 9,041,464 B2 | 5/2015 | Komninakis et al. | |
| 9,055,529 B2 | 6/2015 | Shih | |
| 9,525,205 B2 * | 12/2016 | Oh | H01Q 3/38 |
| 9,806,929 B2 | 10/2017 | Farabegoli et al. | |
| 9,906,428 B2 | 2/2018 | Kim et al. | |
| 10,056,941 B2 | 8/2018 | Weissman et al. | |
| 10,298,276 B2 * | 5/2019 | Pratt | H04B 1/0475 |
| 2010/0311353 A1 * | 12/2010 | Teillet | H01Q 1/246 455/84 |
| 2016/0380682 A1 | 12/2016 | Sienkiewicz et al. | |
| 2017/0303118 A1 | 10/2017 | Ahmed et al. | |
| 2018/0219566 A1 | 8/2018 | Weissman et al. | |

OTHER PUBLICATIONS

International Search Report and Written Opinion received for PCT Application Serial No. PCT/US2019/058987 dated Feb. 7, 2020, 16 pages.

Tervo et al., "Digital Predistortion of Amplitude Varying Phased Array Utilising Over-the-Air Combining", IEEE MTT-S International Microwave, Jun. 4, 2017, pp. 1165-1168.

Brihuega et al., "Digital Predistortion in Large-Array Digital Beamforming Transmitters", Arxiv.org, Cornell University Library, 201 Olin Library Cornell University, Dec. 4, 2018, pp. 611-618.

* cited by examiner

REDUCTION AND/OR MITIGATION OF SPATIAL EMISSIONS IN MULTI-ANTENNA WIRELESS COMMUNICATION SYSTEMS FOR ADVANCED NETWORKS

TECHNICAL FIELD

The subject disclosure relates generally to communications systems with multiple antennas, and for example, to facilitating reduction and/or mitigation of spatial emissions in a wireless communications system with multiple antennas for advanced networks (e.g., 5G and beyond).

BACKGROUND

To meet the huge demand for data centric applications, Third Generation Partnership Project (3GPP) systems and systems that employ one or more aspects of the specifications of the Fourth Generation (4G) standard for wireless communications will be extended to a Fifth Generation (5G) standard for wireless communications. Unique challenges exist to provide levels of service associated with forthcoming 5G, or other next generation, standards for wireless communication.

BRIEF DESCRIPTION OF THE DRAWINGS

Various non-limiting embodiments are further described with reference to the accompanying drawings in which.

DETAILED DESCRIPTION

Figure 1:
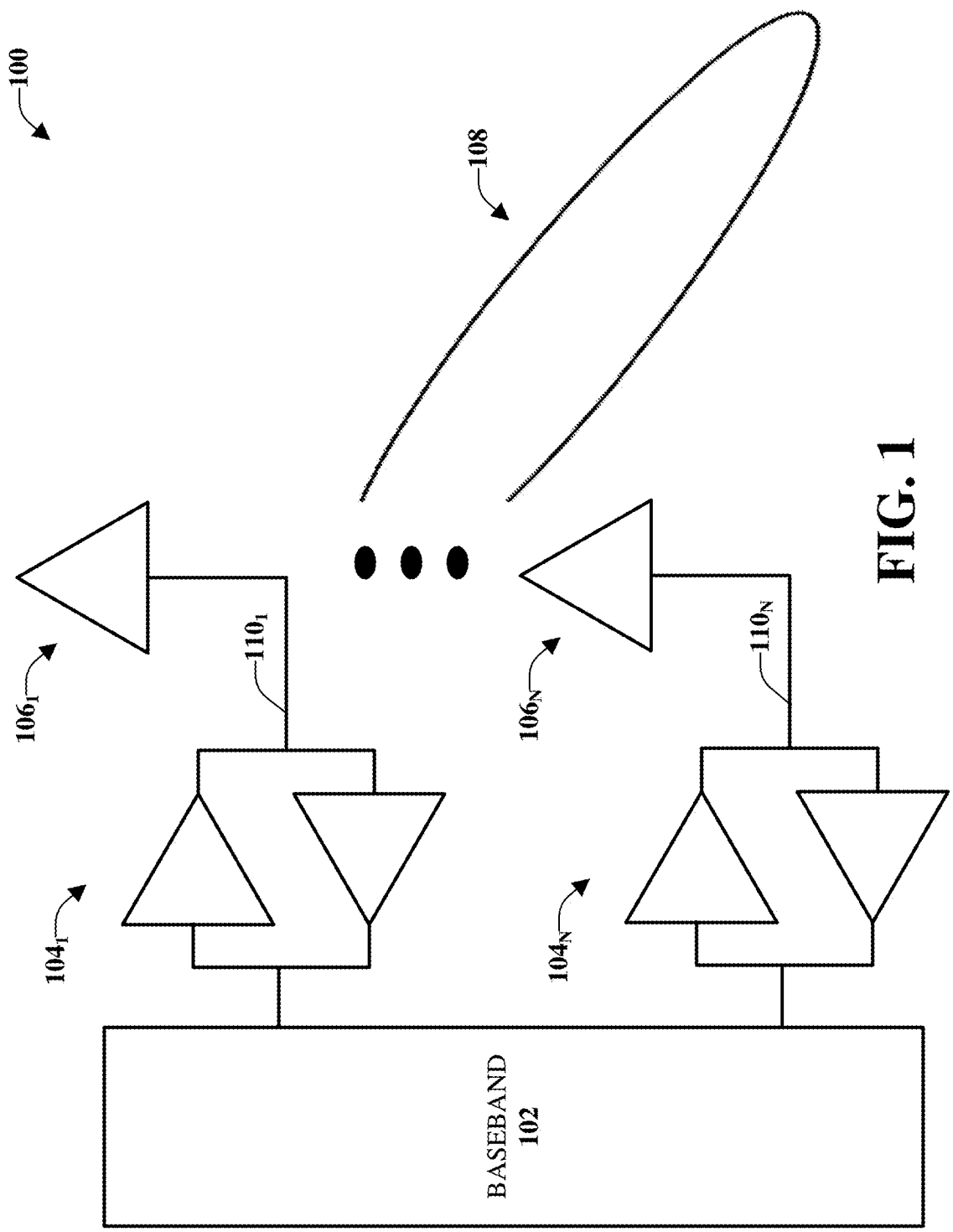
FIG. 1 illustrates an example schematic representation of an active-array-antenna system.

One or more embodiments are now described more fully hereinafter with reference to the accompanying drawings in which example embodiments are shown. In the following description, for purposes of explanation, numerous specific details are set forth in order to provide a thorough understanding of the various embodiments. However, the various embodiments can be practiced without these specific details (and without applying to any particular networked environment or standard).

Discussed herein are various aspects that relate to mitigating and/or reducing spatial emissions in a wireless communications network comprising multiple antennas. For example, as provided herein reduction and/or mitigation of spatial emissions can be facilitated such that Active-Array Antenna Systems (AAS) can co-exist with other systems. As discussed herein a Power Amplifier (PA) can be linearized, which can reduce and/or mitigate Adjacent Channel Leakage Ratio (ACLR). Further, with linearization of the power amplifier, the spatial emissions in azimuth and elevation directions can be minimized and/or reduced by checking the radiation pattern. Advantages of the disclosed aspects can comprise reduction and/or mitigation of emission. Another advantage can be increased power amplifier efficiencies. A further advantage can be easy deployment of AAS systems even in the presence of critical systems at adjacent frequencies.

The various aspects described herein can relate to New Radio (NR), which can be deployed as a standalone radio access technology or as a non-standalone radio access technology assisted by another radio access technology, such as Long Term Evolution (LTE), for example. It should be noted that although various aspects and embodiments have been described herein in the context of 5G, Universal Mobile Telecommunications System (UMTS), and/or Long Term Evolution (LTE), or other next generation networks, the disclosed aspects are not limited to 5G, a UMTS implementation, and/or an LTE implementation as the techniques can also be applied in 3G, 4G, or LTE systems. For example, aspects or features of the disclosed embodiments can be exploited in substantially any wireless communication technology. Such wireless communication technologies can include UMTS, Code Division Multiple Access (CDMA), Wi-Fi, Worldwide Interoperability for Microwave Access (WiMAX), General Packet Radio Service (GPRS), Enhanced GPRS, Third Generation Partnership Project (3GPP), LTE, Third Generation Partnership Project 2 (3GPP2) Ultra Mobile Broadband (UMB), High Speed Packet Access (HSPA), Evolved High Speed Packet Access (HSPA+), High-Speed Downlink Packet Access (HSDPA), High-Speed Uplink Packet Access (HSUPA), Zigbee, or another IEEE 802.XX technology. Additionally, substantially all aspects disclosed herein can be exploited in legacy telecommunication technologies.

As used herein, "5G" can also be referred to as NR access. Accordingly, systems, methods, and/or machine-readable storage media for facilitating link adaptation of downlink control channel for 5G systems are desired. As used herein, one or more aspects of a 5G network can comprise, but is not limited to, data rates of several tens of megabits per second (Mbps) supported for tens of thousands of users; at least one gigabit per second (Gbps) to be offered simultaneously to tens of users (e.g., tens of workers on the same office floor); several hundreds of thousands of simultaneous connections supported for massive sensor deployments; spectral efficiency significantly enhanced compared to 4G; improvement in coverage relative to 4G; signaling efficiency enhanced compared to 4G; and/or latency significantly reduced compared to LTE.

An embodiment relates to a method that can comprise facilitating, by a network device of a communications network and comprising a processor, a first application of a first pre-distortion signal to a first input signal of a first power amplifier based on a determination that a first output signal of the first power amplifier fails to satisfy a defined output value. The first output signal can comprise a first channel frequency. The method can also comprise facilitating, by the network device, a second application of a second pre-distortion signal to a second input signal of a second power amplifier for a defined azimuth direction associated with a second channel frequency of a second output signal of the second power amplifier. The second output channel frequency can be adjacent the first channel frequency. In addition, the method can comprise facilitating, by the network device, a third application of a third pre-distortion signal to the second input signal of the second power amplifier for a defined elevation direction associated with the second channel frequency of the second output signal.

In an example, the method can comprise mitigating, by the network device, a radiation pattern associated with the first output signal based on facilitating the first application of the first pre-distortion signal, facilitating the second application of the second pre-distortion signal, and facilitating the third application of the third pre-distortion signal. Further to this example, the radiation pattern can be a function of the first output signal, an antenna element pattern in an azimuth domain, and the antenna element pattern in a vertical domain.

According to some implementations, the method can comprise determining, by the network device, that a power level in the second channel frequency is less than a defined threshold azimuth level based on facilitating the second application of the second pre-distortion signal. Further to these implementations, the method can comprise discontinuing, by the network device, the second application of the second pre-distortion signal.

In some implementations, the method can comprise determining, by the network device, that a power level in the second channel frequency is less than a defined threshold elevation level based on facilitating the third application of the third pre-distortion signal. Further to these implementations, the method can comprise discontinuing, by the network device, the third application of the third pre-distortion signal.

In accordance with some implementations, facilitating the second application of the second pre-distortion signal can comprise applying the second pre-distortion signal to a third input signal of a third power amplifier for the defined azimuth direction. Further, a third output signal of the third power amplifier can comprise a third channel frequency that is adjacent to the first channel frequency of the first output signal.

According to some implementations, facilitating the third application of the third pre-distortion signal can comprise applying the third pre-distortion signal to a third input signal of a third power amplifier for the defined elevation direction. Further, a third output signal of the third power amplifier can comprise a third channel frequency that is adjacent to the first channel frequency of the first output signal.

In an example, the first pre-distortion signal, the second pre-distortion signal, and the third pre-distortion signal are digital pre-distortion signals. In another example, the first pre-distortion signal, the second pre-distortion signal, and the third pre-distortion signal are analog pre-distortion signals. According to some implementations, the first output signal and the second output signal are signals configured to operate according to a fifth generation wireless network communication protocol. In some implementations, the first output signal and the second output signal are signals configured to operate according to a sixth generation wireless network communication protocol.

According to another embodiment, a system can comprise a processor and a memory that stores executable instructions that, when executed by the processor, facilitate performance of operations. The operations can comprise applying a first signal linearization to a first output signal of a first power amplifier based on a determination that an adjacent channel leakage ratio of the first output signal of the first power amplifier fails to satisfy a defined output value. The operations can also comprise applying a second signal linearization to a group of output signals of a group of power amplifiers for a defined azimuth direction associated with channel frequencies of the group of output signals. The channel frequencies of the group of output signals can be adjacent to a channel frequency of the first output signal. The operations can also comprise applying a third signal linearization to the group of output signals for a defined elevation direction associated with the channel frequencies of the group of output signals.

According to some implementations, the operations can comprise reducing an effect of a radiation pattern associated with the first output signal to the group of output signals. Reducing the effect can be based on applying the first signal linearization, the second signal linearization, and the third signal linearization. In addition, the radiation pattern can be a function of the first output signal, an antenna element pattern in an azimuth domain, and the antenna element pattern in a vertical domain.

In some implementations, the operations can comprise discontinuing the first signal linearization based on a first determination that the adjacent channel leakage ratio of the first output signal of the first power amplifier satisfies the defined output value. According to some implementations, the operations can comprise discontinuing the second signal linearization based on a second determination that a first power level in the channel frequency that is adjacent the first output signal is less than a defined threshold azimuth level. Further, in some implementations, the operations can comprise discontinuing the third signal linearization based on a third determination that a second power level in the channel frequency that is adjacent to the first output signal is less than a defined threshold elevation level.

According to yet another embodiment, described herein is a machine-readable storage medium comprising executable instructions that, when executed by a processor, facilitate performance of operations. The operations can comprise implementing a first signal linearization to a first input signal of a first power amplifier based on a determination that a first output signal of the first power amplifier satisfies a defined output value. The first output signal can comprise a first channel frequency. The operations can also comprise implementing a second signal linearization to a second input signal of a second power amplifier for a defined azimuth direction associated with a second channel frequency of a second output signal of the second power amplifier. The second channel frequency can be adjacent to the first channel frequency. Further, the operations can comprise implementing a third signal linearization to the second input signal of the second power amplifier for a defined elevation direction associated with the second channel frequency of the second output signal.

According to some implementations, the operations can comprise determining that an adjacent channel leakage ratio of the first output signal of the first power amplifier satisfies the defined output value and discontinuing the implementing the first signal linearization.

In some implementations, the operations can comprise determining that a power level in the second channel frequency is less than a defined threshold elevation level based on implementing the second signal linearization and discontinuing the implementing the second signal linearization.

In accordance with some implementations, the operations can comprise determining that a power level in the second channel frequency is less than a defined threshold azimuth level based on implementing the third signal linearization and discontinuing the implementing the third signal linearization.

FIG. 1 illustrates an example schematic representation of an AAS array system 100. The AAS array system 100 can comprise a baseband component 102, one or more power amplifiers $104_1$ through $104_N$, and one or more antennas $106_1$ through $106_N$, where N is an integer. Also illustrated is a radiation beam or radiation pattern 108.

In AAS (e.g., the AAS array system 100), Radio Frequency (RF) components, such as power amplifiers and transceivers, can be integrated with an array of antenna elements (e.g., the one or more antennas $106_1$ through $106_N$). This can offer several benefits compared to deployments with passive antennas connected to transceivers through feeder cables, as will be discussed with respect to FIG. 2.

Figure 2:
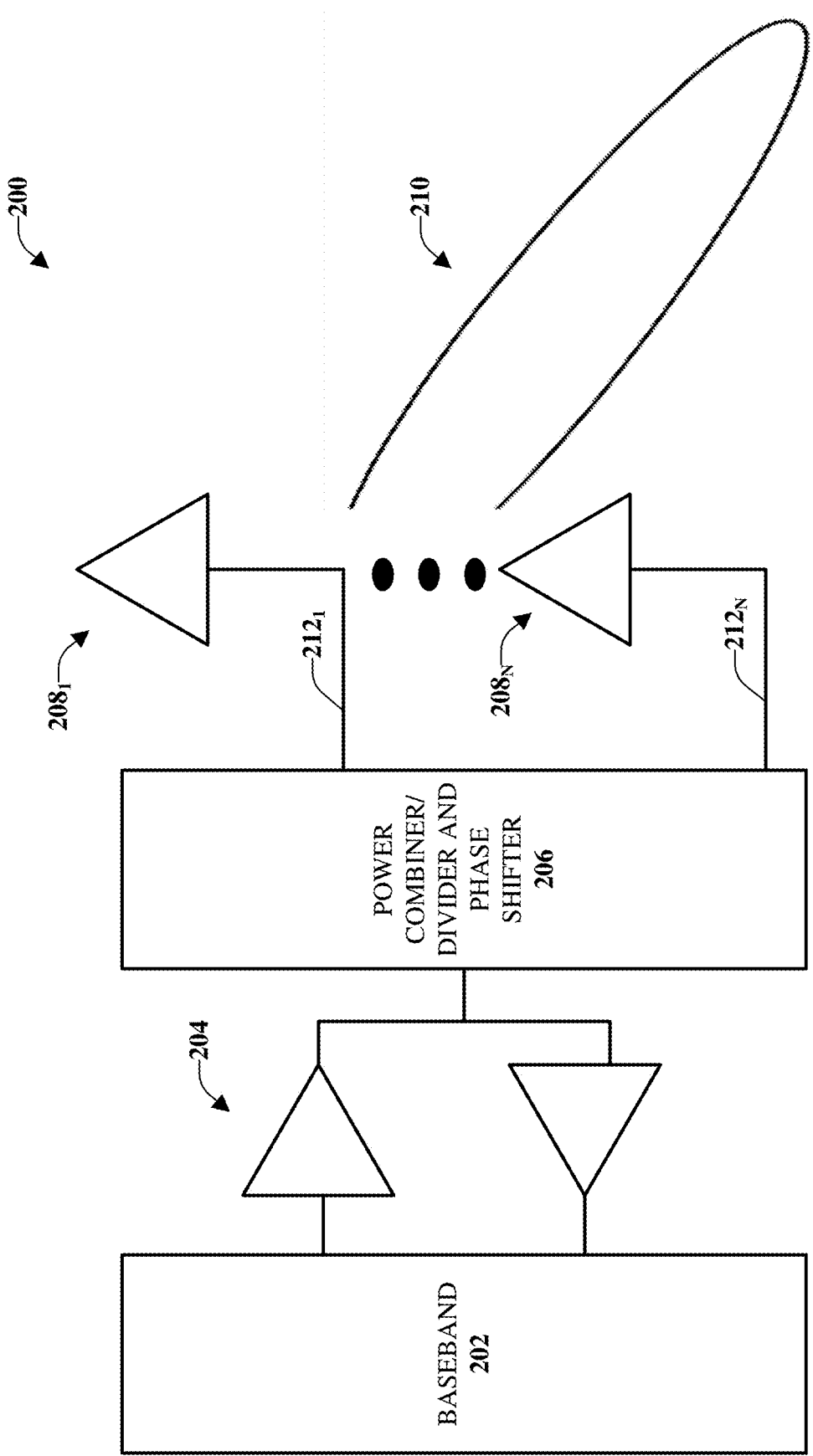
FIG. 2 illustrates an example schematic representation of a passive antenna array system.

FIG. 2 illustrates an example schematic representation of a passive antenna array system 200. In this system, the baseband signals (e.g., from a baseband component 202) can be boosted by a power amplifier 204, connected to a power combiner/divider and phase shifter component 206 and connected to one or more antennas $208_1$-$208_N$. Also illustrated is the radiation pattern 210. In this case, the one or more antennas $208_1$-$208_N$ are connected via longer feedback cables 2121-212N, as compared to the configuration of FIG. 1 that comprises shorter feedback cables $110_1$-$110_N$. By using an active antenna array, not only are cable losses reduced, leading to improved performance and reduced energy consumption, but also the installation can be simplified. In addition, the necessary equipment space can be reduced.

There can many applications of active antennas including, for example, cell specific beamforming, user specific beamforming, vertical sectorization, massive Multiple Input, Multiple Output (MIMO), elevation beamforming and so on. Further, active antennas could also be an enabler for further-advanced antenna concepts such as deploying a large number of MIMO antenna elements at the eNode B. However, all these techniques will be useful in practice if proper specification of relevant RF and electro-magnetic compatibility (EMC) requirements are in place.

Figure 3:
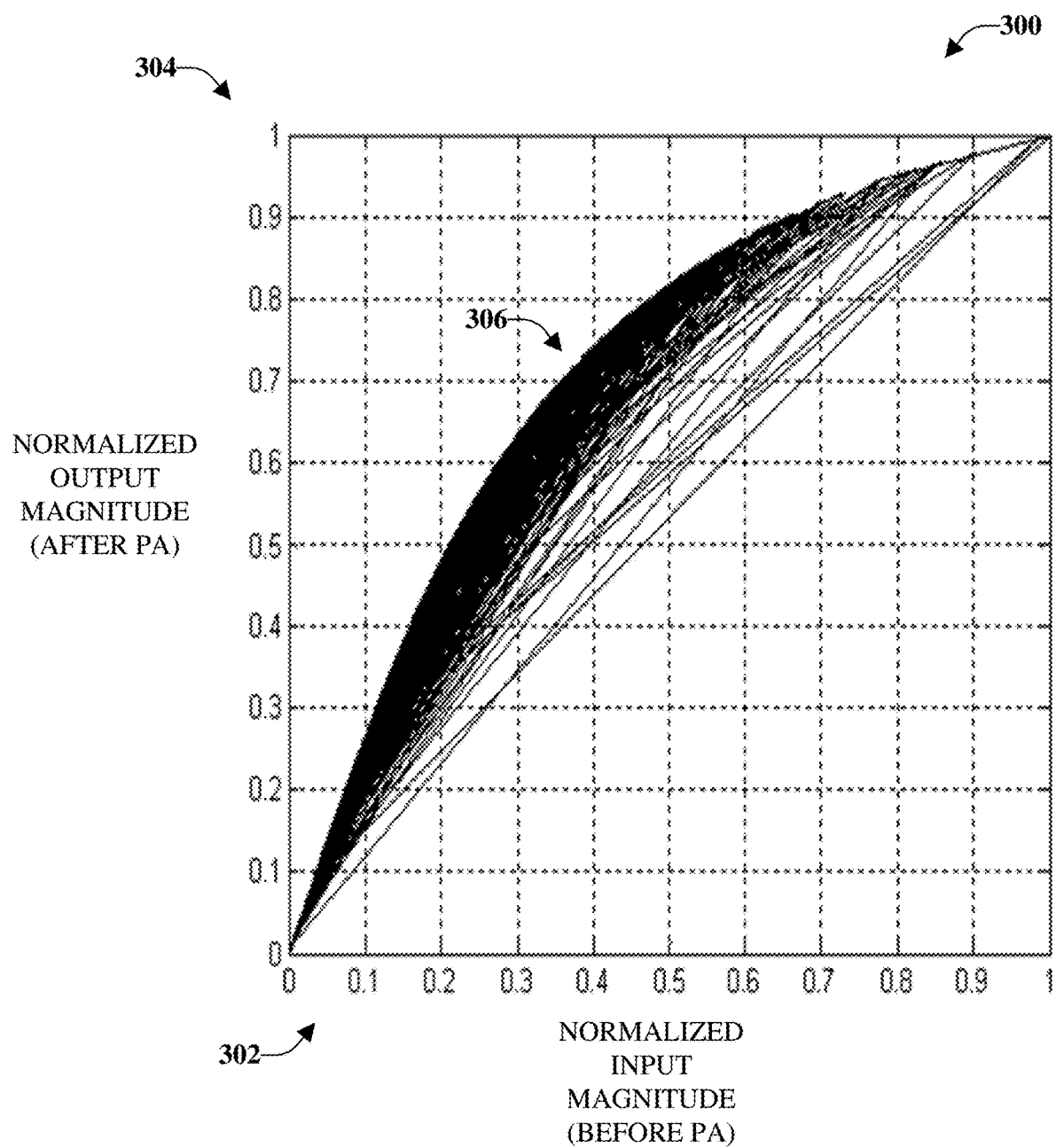
FIG. 3 illustrates an example graph of amplitude-to-amplitude modulation performance of a power amplifier.

There can be an impact due to power amplifier nonlinearity. In general, the power amplifier should be operated in the non-linear region for achieving good efficiency. FIG. 3 illustrates an example graph 300 of amplitude-to-amplitude modulation (AM/AM) performance of a power amplifier. The horizontal axis 302 represents the normalized input magnitude (before the power amplifier) and the vertical axis 304 represents the normalized output magnitude (after the power amplifier). As depicted, the input/output curve 306 can be highly non-linear.

Figure 4:
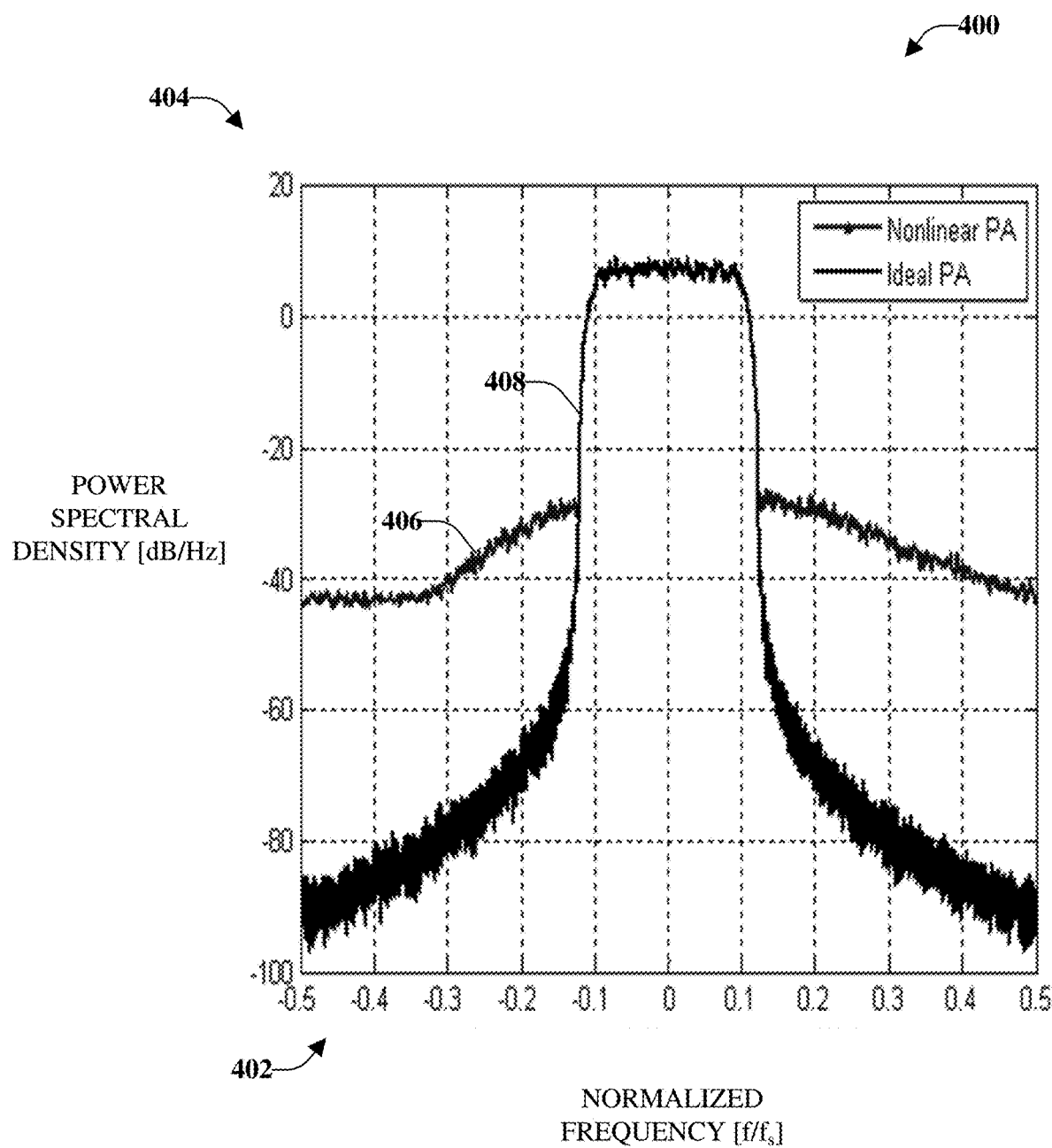
FIG. 4 illustrates an example graph of power spectral density with a realistic power amplifier.

However, when the power amplifier operates in the non-linear region, some of the signals are leaked to the other frequency bands. FIG. 4 illustrates an example graph 400 of power spectral density with a realistic power amplifier. The horizontal axis 402 represents normalized frequency [$f/f_s$]. The vertical axis 404 represents power spectral density in decibel/Hertz (dB/Hz). Further, the first line 406 illustrates nonlinear power amplifier and the second line 408 illustrates an ideal power amplifier. Accordingly, depicted is the spectral regrowth due to power amplifier non-linearity.

Adjacent channel leakage ratio can be used as a metric to measure the leakage due to a non-linear power amplifier. In the example of FIG. 4, the ACLR with an ideal power amplifier is around −78.1 dBc or decibels relative to the carrier (e.g., the second line 408), while with a realistic power amplifier (with non-linearity), the ACLR is around −41.1 dBc (e.g., the first line 406).

As discussed herein, pre-distortion techniques for mitigating the power amplifier nonlinearity can be provided. In some cases, a method to compensate for the non-linearity of the power amplifier can include distorting the input signal to the power amplifier such that the output signal from the power amplifier is transformed to be close to what it would have been if the power amplifier would have been linear. An example of such a method is referred to at the Digital Pre-Distortion (DPD) technique. DPD can interchangeably be referred to as a signal linearization circuitry or component or mechanism or protocol. Further, although discussed with respect to digital pre-distortion, the disclosed aspects can be utilized with analog pre-distortion and/or another type of pre-distortion.

Figure 5:
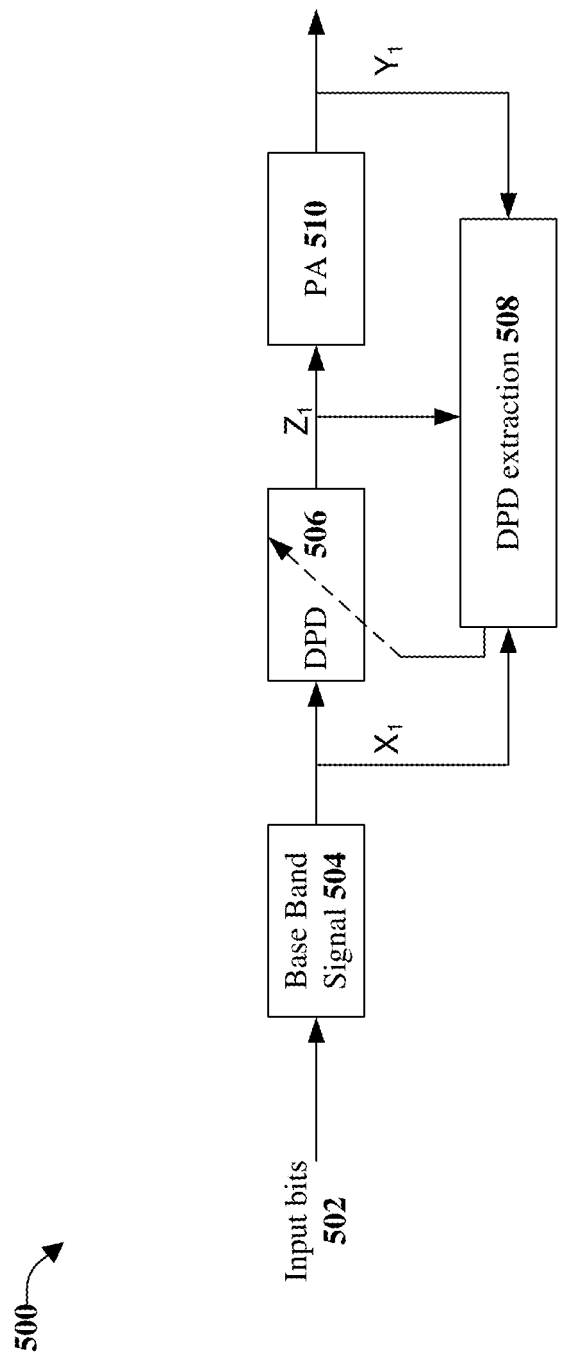
FIG. 5 illustrates an example block diagram of a transmitter with a digital pre-distortion system that utilizes a technique for compensating nonlinear effects of a power amplifier according to one or more embodiments.

FIG. 5 illustrates an example block diagram of a transmitter with a DPD system 500 that utilizes a technique for compensating nonlinear effects of a power amplifier according to one or more embodiments. As illustrated, one or more input bits 502 are received as a base band signal component 504. An output signal $x_1$ of the based band signal component is transmitted to a DPD component 506 and a DPD extraction component 508. An input signal ($z_1$) is applied to a power amplifier 510, which has an output signal ($y_1$), which can be fed back (e.g., via a feedback look) to the DPD extraction component 508.

For the following example, $y_1$ is the output signal at the output of the power amplifier 510, $x_1$ is the output signal from the baseband (e.g., the base band signal component 504), and z1 is the input signal to the power amplifier 510. Note that, in this model, only the impact due to a nonlinear power amplifier is considered. Further, in practical systems, the power amplifier is preceded by many other blocks such as digital to analog converter (DAC), local oscillator (LO), and so on (not illustrated). The output signal can be expressed as:

$$y_1 = f_1(z_1)$$ Equation 1.

where $f_1(.)$ is a nonlinear function which characterizes the power amplifier. With DPD, the above equations can be written as:

$$y_2 = f_1(g_1(x_1))$$ Equation 2.

where $g_1(.)$ is the function which characterizes the DPD block. It is noted that DPD extraction block is chosen such that:

$$y_2 = f_1(g_1(x_1)) = G_1 x_1,$$ Equation 3.

where G1 is the gain of the power amplifier. It can be determined from above equation that if g1 is properly chosen then the output of the power amplifier is linear.

Figure 6:
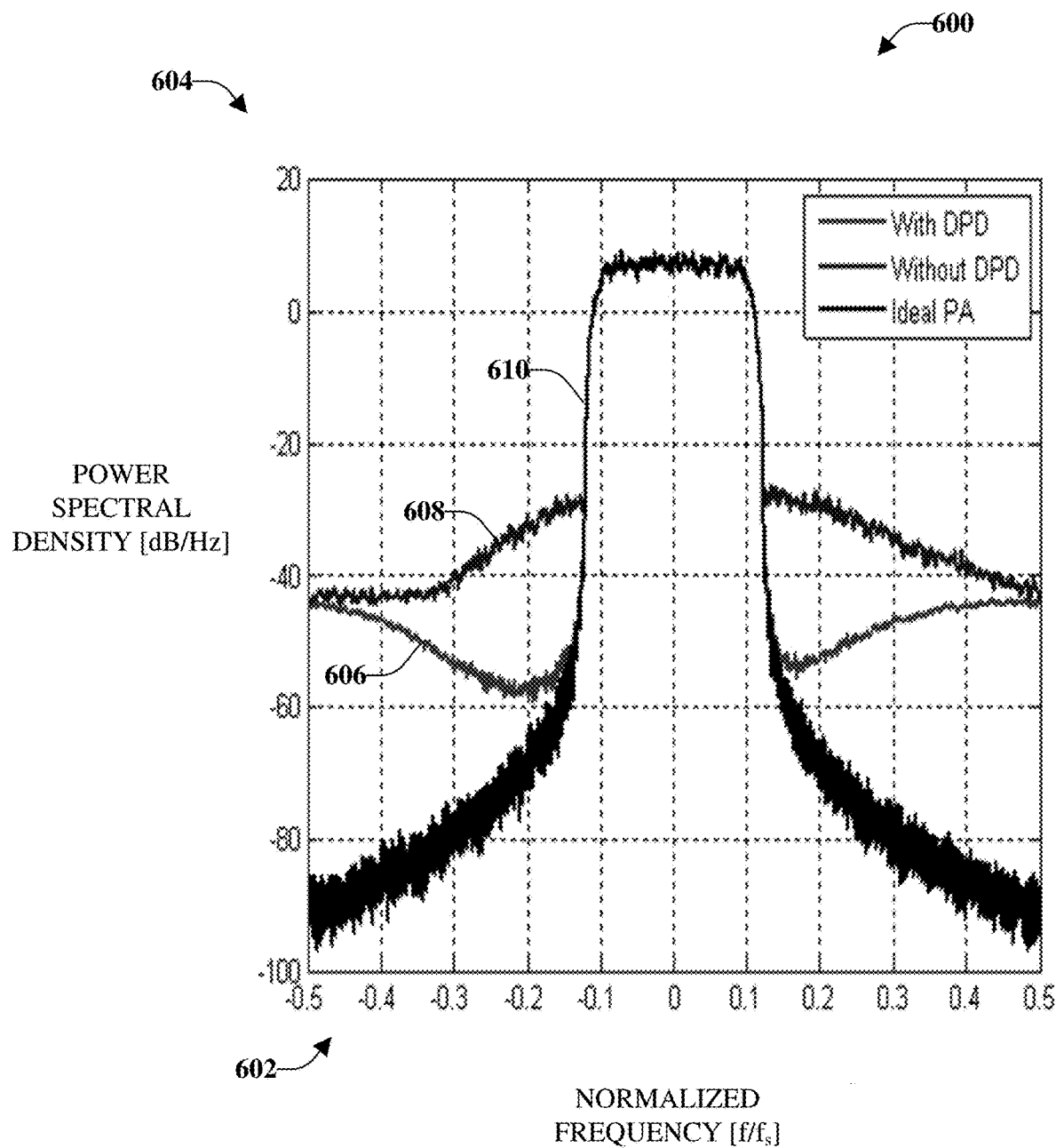
FIG. 6 illustrates an example graph of power spectral density with a realistic power amplifier and digital pre-distortion.

FIG. 6 illustrates an example graph 600 of power spectral density with a realistic power amplifier and DPD. The horizontal axis 602 represents the normalized frequency [f/f_s]. The vertical axis 604 represents the power spectral density [dB/Hz]. The first line 606 indicates the power spectral density with DPD. The second line 608 indicates the power spectral density without DPD. Further, the third line 610 indicates the power spectral density of an ideal power amplifier.

In further detail, FIG. 6 depicts the spectral regrowth with DPD. Accordingly, it can be observed that the spectral regrowth is reduced when DPD is applied. ACLR in this example is around −60 dBc.

Figure 7:
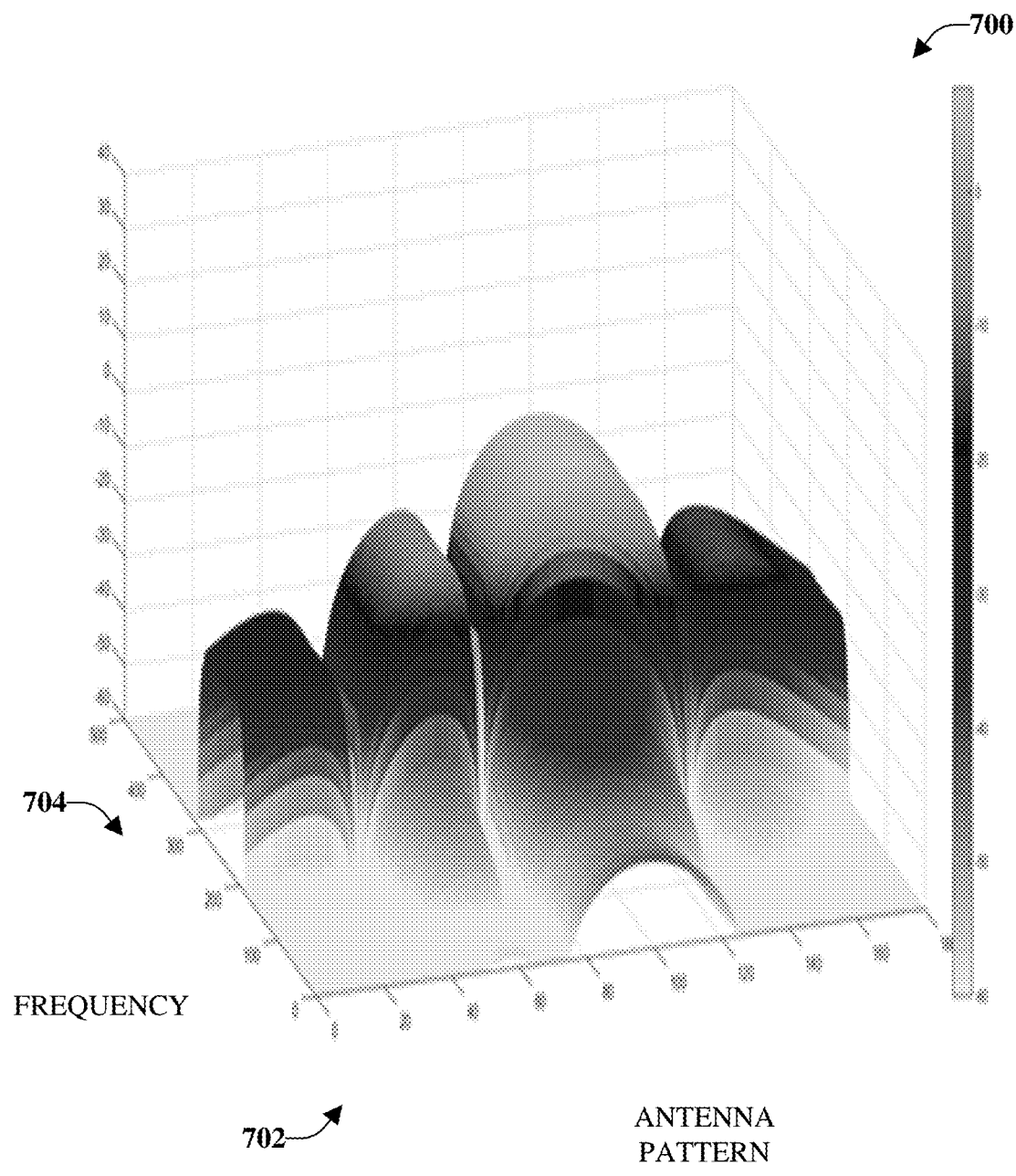
FIG. 7 illustrates an example three-dimensional plot of power spectral density as a function of antenna pattern and frequency.

When the transmitter is equipped with multiple antenna elements (e.g., AAS, the AAS array system 100 of FIG. 1), the antenna elements can be used for beamforming, for multiplexing, or for both at substantially the same time. When the antenna elements are used for beamforming purposes, due to the non-linearity of the power amplifier, the emissions are also beamformed. FIG. 7 illustrates an example three-dimensional plot 700 of Power Spectral Density (PSD) as a function of antenna pattern (illustrated on the horizontal axis 702) and frequency (illustrated on the vertical axis). The three-dimensional plot 700 represents four antenna elements for this example.

Figure 8:
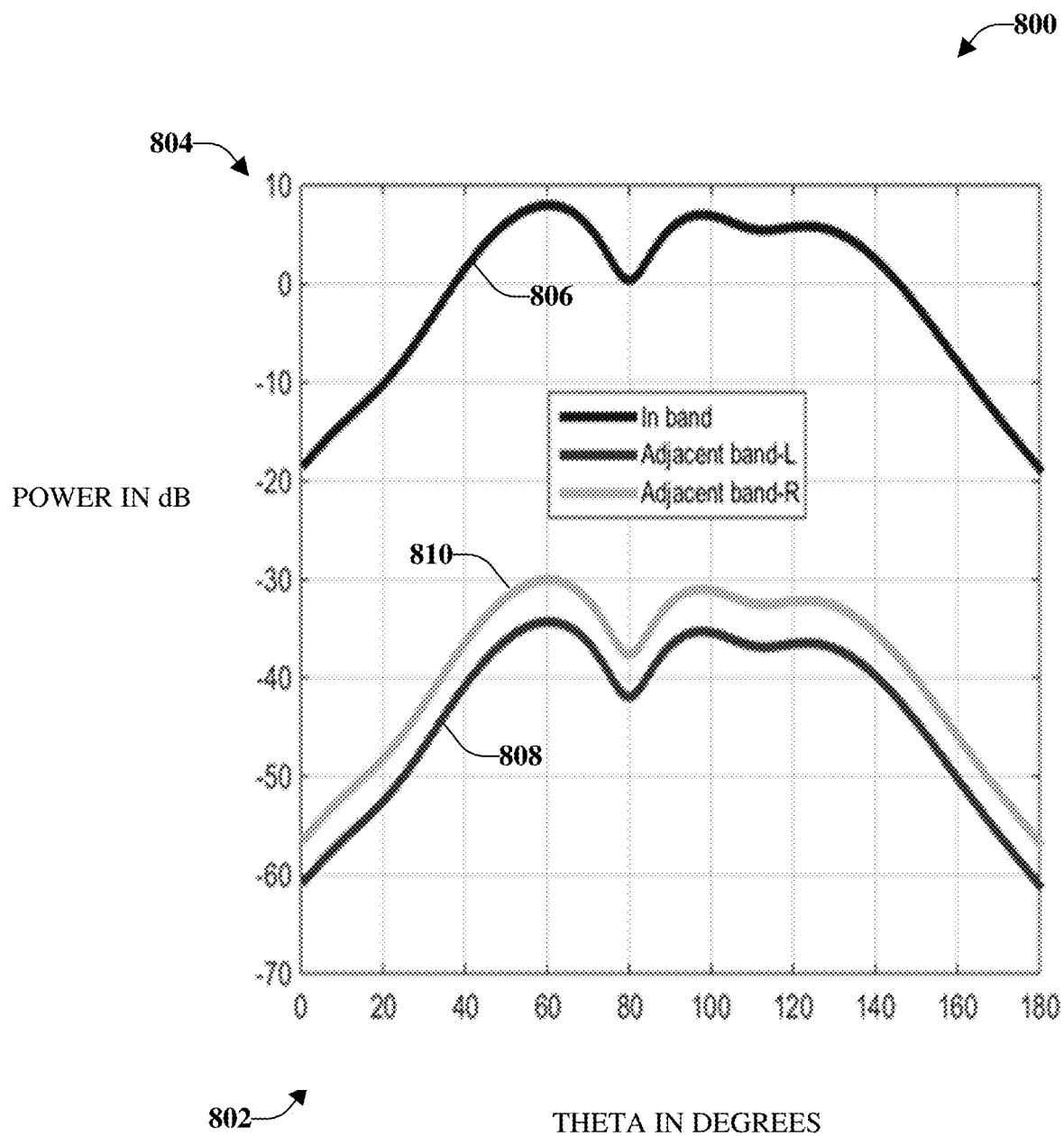
FIG. 8 illustrates an example graph of power spectral density as a function of antenna pattern at an adjacent frequency.

FIG. 8 illustrates an example graph 800 of power spectral density as a function of antenna pattern at an adjacent frequency. The horizontal axis 802 represents theta in degrees and the vertical axis 804 represents power in dBs. The first line 806 indicates in band, the second line 808 indicates adjacent band-L, and the third line 810 indicates adjacent band-R. In further detail, FIG. 8 depicts the emission in a 2D plot where the power spectral density is plotted at a given frequency is plotted as a function of antenna pattern (theta).

Figure 9:
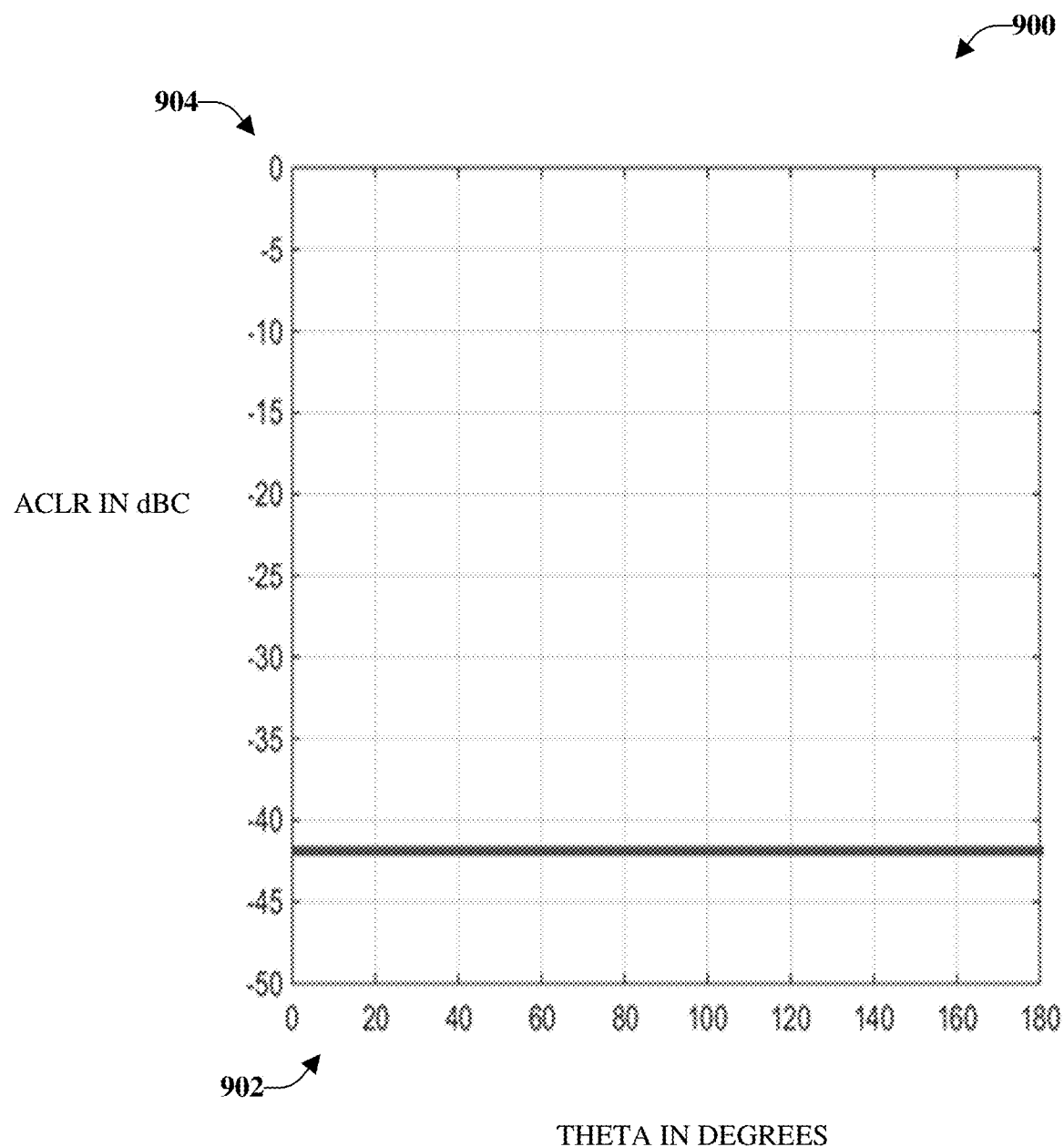
FIG. 9 illustrates an example graph of adjacent channel leakage ratio as a function of antenna pattern.
Figure 10:
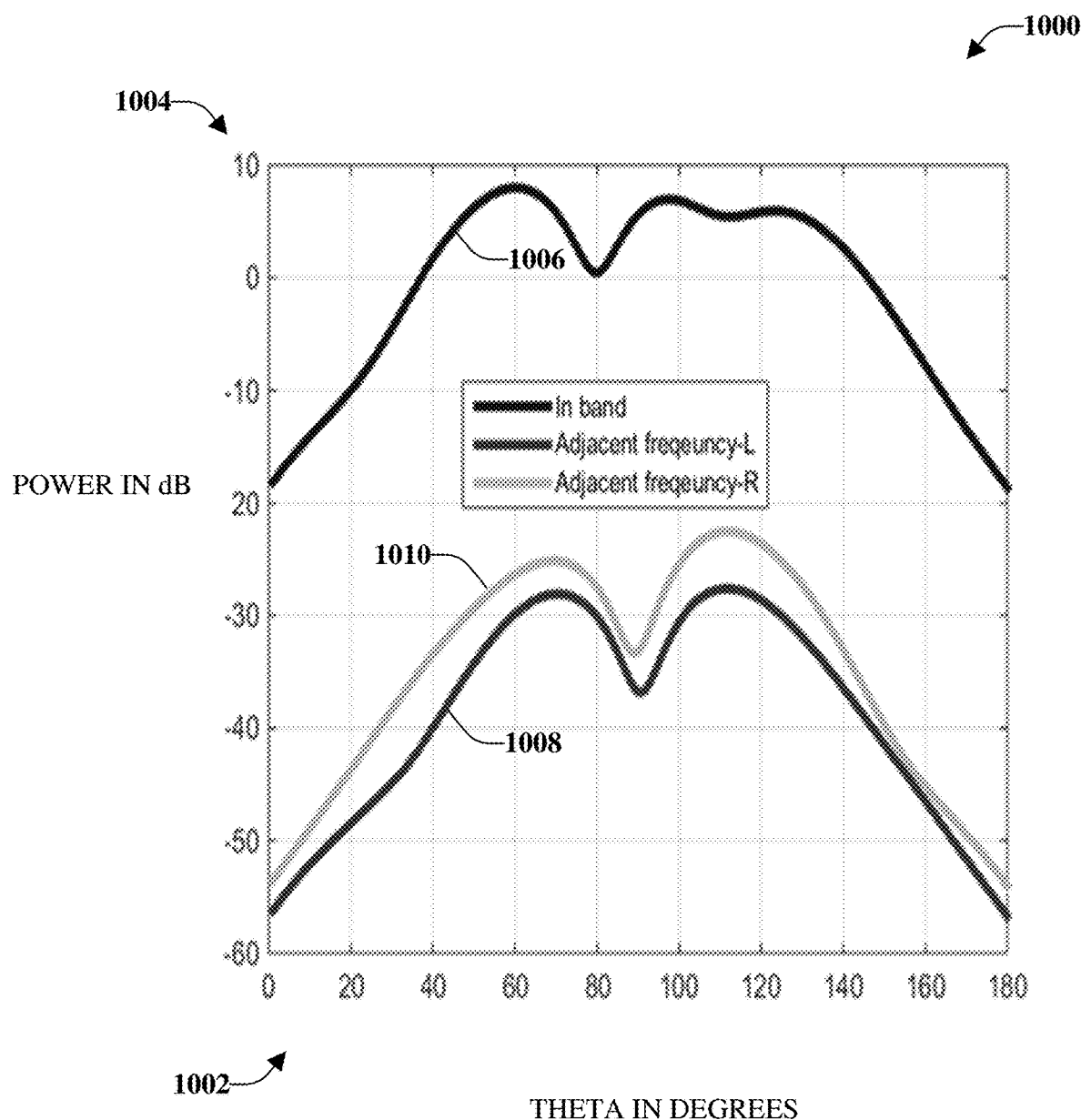
FIG. 10 illustrates an example graph of power spectral density as a function of antenna pattern at the adjacent frequency with un-identical power amplifiers for each antenna element.

FIG. 9 illustrates an example graph 900 of the ACLR as a function of antenna pattern. The horizontal axis 902 represents theta in degrees and the vertical axis 904 represents ACLR in dBc. FIGS. 7, 8, and 9 were generated by assuming identical power amplifier for each antenna element. However, in practice, the power amplifiers for each antenna element can be different and, in these cases, the emissions can be beamformed in different directions. FIG. 10 illustrates an example graph 1000 of PSD as a function of antenna pattern at the adjacent frequency with un-identical power amplifiers for each antenna element. The horizontal axis 1002 represents theta in degrees and the vertical axis 1004 represents power in db. The first line 1006 indicates in band, the second line 1008 indicates adjacent band-L, and the third line 1010 indicates adjacent band-R.

Figure 11:
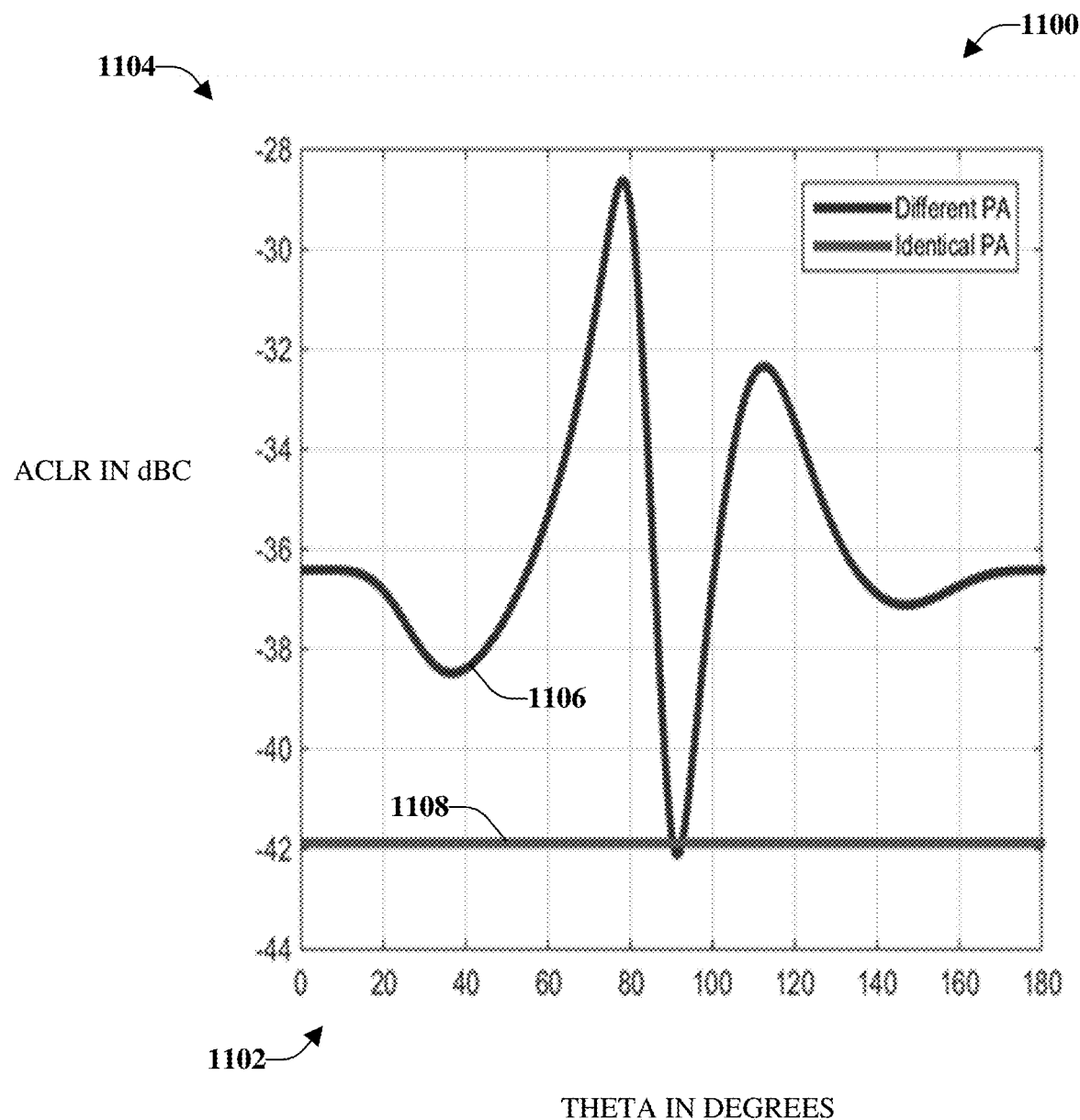
FIG. 11 illustrates adjacent channel leakage ratio as a function of antenna pattern with un-identical power amplifiers for each antenna element.

In these cases, the ACLR is a function of theta and is different, as depicted in FIG. 11, which illustrates ACLR as a function of antenna pattern with un-identical power amplifiers for each antenna element. The horizontal axis 1102 represents theta in degrees and the vertical axis 1104 represents ACLR in dBc. The first line 1106 indicates different PAs and the second line 1108 indicates identical PAs.

As illustrated in FIG. 11, the power spectral density is a function of antenna pattern and the emissions (adjacent channel) are beamformed in the sense that in some directions the emissions are high and in some directions the emissions are low. When the emissions are beamformed, these unwanted emissions can cause interference to the other systems deployed at the adjacent frequencies. For example, when critical healthcare systems are operating in the adjacent frequency and the emissions are beamformed, this can result in a complete non-usage of the health care system.

One or more embodiments relate to reduction and/or mitigation of spatial emissions such that the AAS systems can co-exist with other systems. In various implementations, the power amplifier can be linearized such that not only ACLR can be reduced and/or mitigated, but also the spatial emissions in azimuth and elevation directions can be minimized and/or reduced by checking the radiation pattern. The disclosed aspects can provide AAS systems that can be easily deployed, even in the presence of critical systems at adjacent frequencies.

Linearization of power amplifier DPD techniques are mentioned herein. However, the compensation techniques are not limited to digital domain (as in DPD). Instead, the same, or a similar, concept can be used for Analog Pre-Distortion (APD). Further, the various embodiments are explained using two and four antenna elements. However, the same idea is applicable for any number of elements (e.g., 16, 32, 64, or M transmit antennas, where M is the number of antenna elements).

For purposes of explanation, consider an AAS system with M antenna elements. Let at time $y_m(n)$ is the output of the power amplifier at time instance n, then the radiated antenna pattern with this $y_m(n)$ is given by:

$$\overline{E}_{tot}(\theta, \varphi)[n] = \sum_{m=1}^{M} y_m[n] E_m(\theta, \varphi)$$

where $E_m(\theta, \varphi)$ is the $m^{th}$ element radiation pattern, and the $E_{tot}[n]$ is the total radiation pattern. It can be observed that the radiation pattern depends on the output signal at the power amplifier, and the antenna element pattern in the azimuthal domain and the vertical domain.

Figure 12:
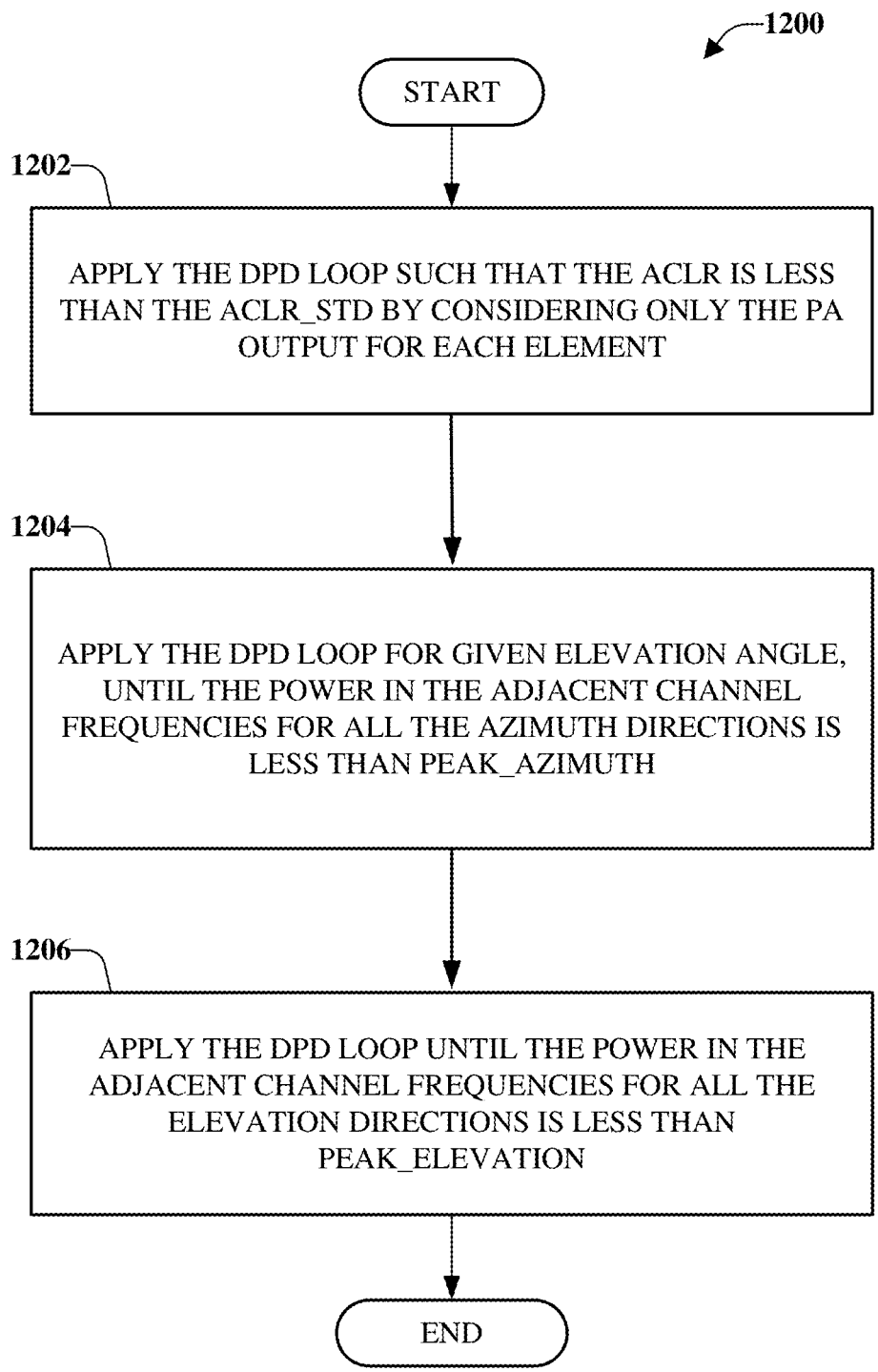
FIG. 12 illustrates a flow diagram of an example, non-limiting, computer-implemented method that facilitates reduction and/or mitigation of spatial emissions in multi-antenna wireless communication systems in accordance with one or more embodiments described herein.

FIG. 12 illustrates a flow diagram of an example, non-limiting, computer-implemented method 1200 that facilitates reduction and/or mitigation of spatial emissions in multi-antenna wireless communication systems in accordance with one or more embodiments described herein.

The computer-implemented method 1200 can comprise applying, at 1202, the DLP loop such that the ACLR is less than ACLR-STD by considering only the power amplifier output for each element. Further, at 1204, the DPD loop can be applied for a given elevation angle until the power in the adjacent channel frequencies for all the azimuth directions is less than PEAK_AZIMUTH. At 1206, the DLP loop can be applied until the power in the adjacent channel frequencies for all the elevation directions is less than PEAK_EVALUATION.

Figure 13:
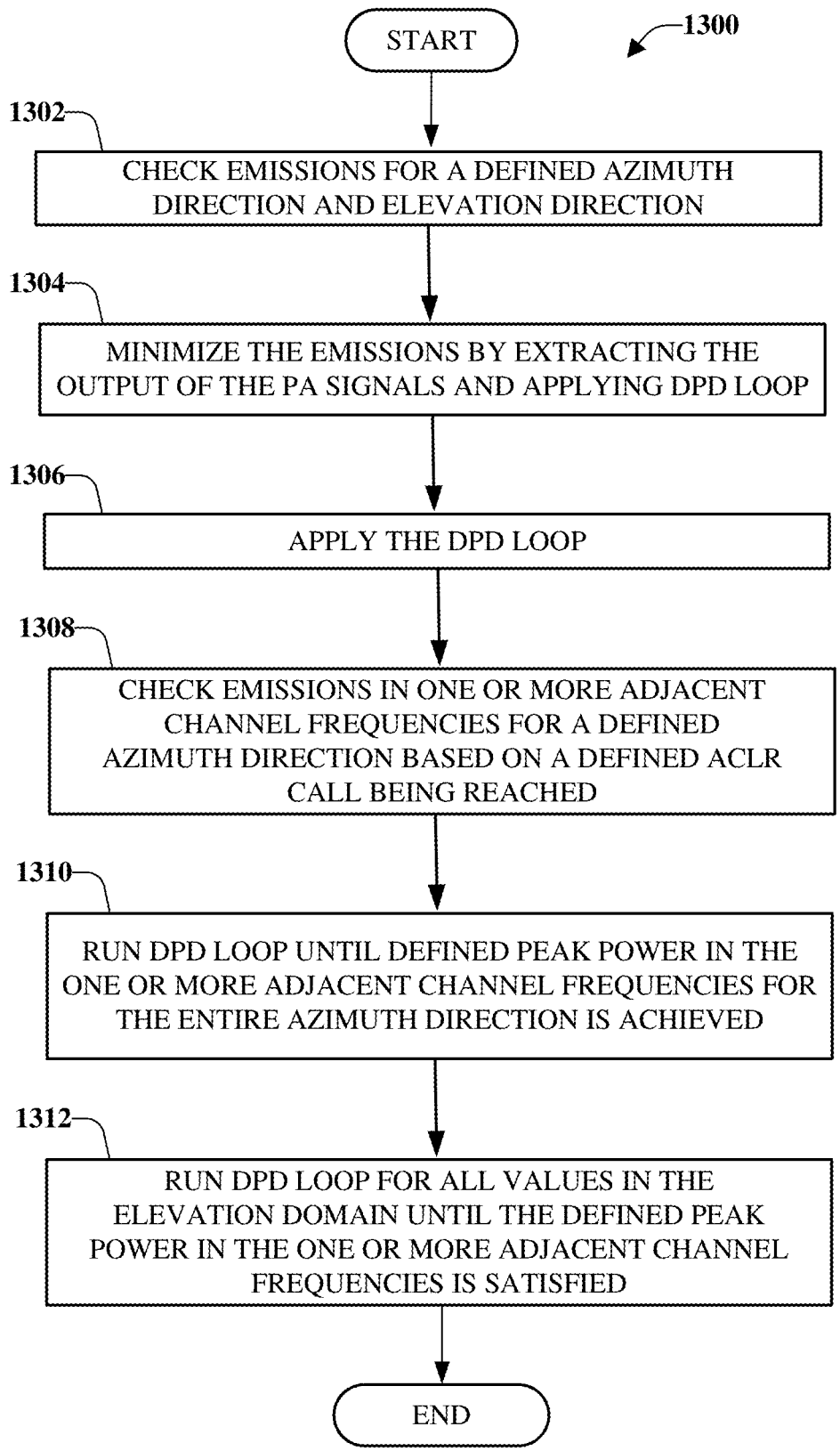
FIG. 13 illustrates another flow diagram of an example, non-limiting, computer-implemented method that facilitates reduction and/or mitigation of spatial emissions in multi-antenna wireless communication systems in accordance with one or more embodiments described herein.

FIG. 13 illustrates another flow diagram of an example, non-limiting, computer-implemented method 1300 that facilitates reduction and/or mitigation of spatial emissions in multi-antenna wireless communication systems in accordance with one or more embodiments described herein.

At 1302, emissions for a defined azimuth direction and elevation direction can be checked. According to an example, a decision block at the transmission node (e.g., of FIG. 1 comprising two (or more) antenna elements) can check emissions for a defined azimuth direction and a defined elevation direction. At 1304, the emissions can be minimized and/or reduced. For example, the minimization and/or reduction can be achieved by extracting the output of the power amplifier signals. The DPD loop can be applied, at 1306, as discussed above.

Upon or after the defined ACLR (which can be referred as a standard ACLR or ACLR_STD) is reached, emissions in one or more adjacent channel frequencies for a defined azimuth direction can be checked, at 1308. According to an implementation, the decision block at the transmission mode can perform the checking. The DPD loop can be run again, at 1310, until the desired peak power (e.g., a first threshold peak power, or a PEAK_AZIMUTH) in the adjacent channel frequencies for the entire azimuth direction is satisfied (e.g., reached). Upon or after the azimuth loop is finished, the DPD loop can be run, at 1312, for all the values in the elevation domain until the desired peak power (e.g., a second threshold peak power, or a PEAK_ELEVATION) in the adjacent channel frequencies is reached (e.g., satisfied). Accordingly, the AAS base station can ensure that the emissions which are beamformed are minimized in the adjacent channel frequencies, which can facilitate the easy deployment of AAS base stations with other systems.

Figure 14:
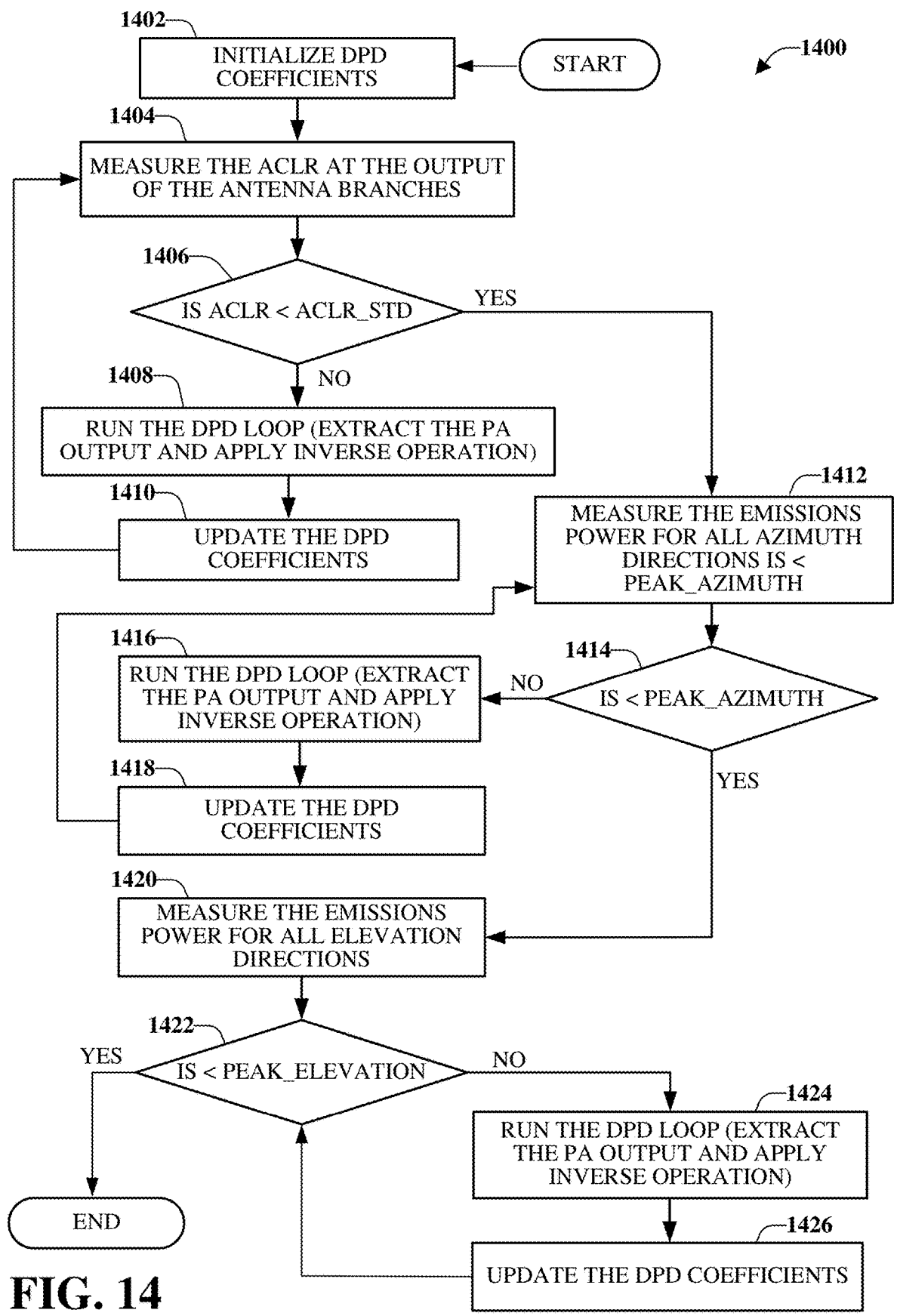
FIG. 14 illustrates a flow diagram of an example, non-limiting, computer-implemented method that facilitates reduction and/or mitigation of spatial emissions such that active-array-antenna systems can co-exist with other systems in multi-antenna wireless communication systems in accordance with one or more embodiments described herein.

FIG. 14 illustrates a flow diagram of an example, non-limiting, computer-implemented method 1400 that facilitates reduction and/or mitigation of spatial emissions such that AAS systems can co-exist with other systems in multi-antenna wireless communication systems in accordance with one or more embodiments described herein.

The computer-implemented method 1400 starts at 1402 when DPD coefficients can be initialized. At 1404, the ACLR at the output of the antenna branches can be measured. Based on the measurement, a determination can be made, at 1406, whether the ACLR is less than a defined value (e.g., a standard ACLR value, ACLR_STD).

If the determination at 1406 is that the ACLR value measured at 1404 is equal to or more than the defined value (e.g., "NO"), the computer-implemented method 1400 continues at 1408, and the DPD loop can be run. For example, to run the DPD loop, the power amplifier output can be extracted, and an inverse operation can be applied. At 1410, the DPD coefficients can be updated and the computer-implemented method 1400 can return to 1404 and the ACLR at the output antenna branches can be re-measured. It is noted that this can be recursive such that any number of DPD loops can be run and any number of DPD coefficients can be updated until a determination is made, at 1406 that the measured ACLR is less than the defined value (e.g., "YES").

If the determination at 1406 is that the ACLR value measured is less than the defined value (e.g., "YES"), at 1412, the emissions power for all azimuth directions can be measured. Based on the measurement, at 1414, a determination can be made whether the emissions power for all azimuth directions is less than a defined azimuth value (e.g., PEAK_AZIMUTH).

If the determination at 1414 is that the emissions power for all azimuth directions is equal to or more than the defined azimuth value ("NO"), at 1416, the DPD loop can be run. For example, to run the DPD loop, the power amplifier output can be extracted, and an inverse operation can be applied. At 1418, the DPD coefficients can be updated and the computer-implemented method 1400 can return to 1412 and the emission power for all azimuth directions can be re-measured. It is noted that this can be recursive such that any number of DPD loops can be run and any number of DPD coefficients can be updated until a determination is made, at 1414 that the emission power for all azimuth directions is less than a defined azimuth value.

If the determination, at 1414, is that the emission power for all azimuth directions is less than the defined azimuth value ("YES"), at 1420, the emission power for all elevation directions can be measured. Based on this measurement, at 1422, a determination can be made whether the emission power for all elevation directions is less than a defined elevation level (e.g., PEAK_ELEVATION).

If the emission power for all elevation directions is more than or equal to the defined elevation level (e.g., "NO"), at 1424, the DPD loop can be run. To run the DPD loop, the power amplifier output can be extracted, and an inverse operation can be applied. Thereafter, at 1426, the DPD coefficients can be updated. The computer-implemented method 1400 can return to 1420 and the emissions power for all elevation directions can be re-measured, the DPD loops can be re-run, and the DPD coefficients can be updated. It is noted that this can be recursive such that any number of DPD loops can be run and any number of DPD coefficients can be updated until a determination is made, at 1422, that the emission power for all elevation directions is less than a defined elevation value.

If the determination at 1422 is that the emission power for all elevation directions is less than the defined elevation level (e.g., "YES"), the computer-implemented method 1400 can end.

According to some implementations, one or more of ACLR_STD, PEAK_AZIMUTH, and/or PEAK_ELEVATION can be fixed values. However, according to some implementations, one or more of ACLR_STD, PEAK_AZIMUTH, and/or PEAK_ELEVATION, can be configurable values. Further, in some implementations, ACLR_STD, PEAK_AZIMUTH, and/or PEAK_ELEVATION can be fixed values and/or configurable values. In a non-limiting example, ACLR_STD can be set to a value of −45dBc (e.g., to meet the 3GPP requirements). Further, in other non-limiting examples, PEAK-AZIMUTH and/or PEAK_ELEVATION can be set to −50 dBC. It is noted that although specific values are provided, the disclosed aspects are not limited to these example and other values can be utilized.

Figure 15:
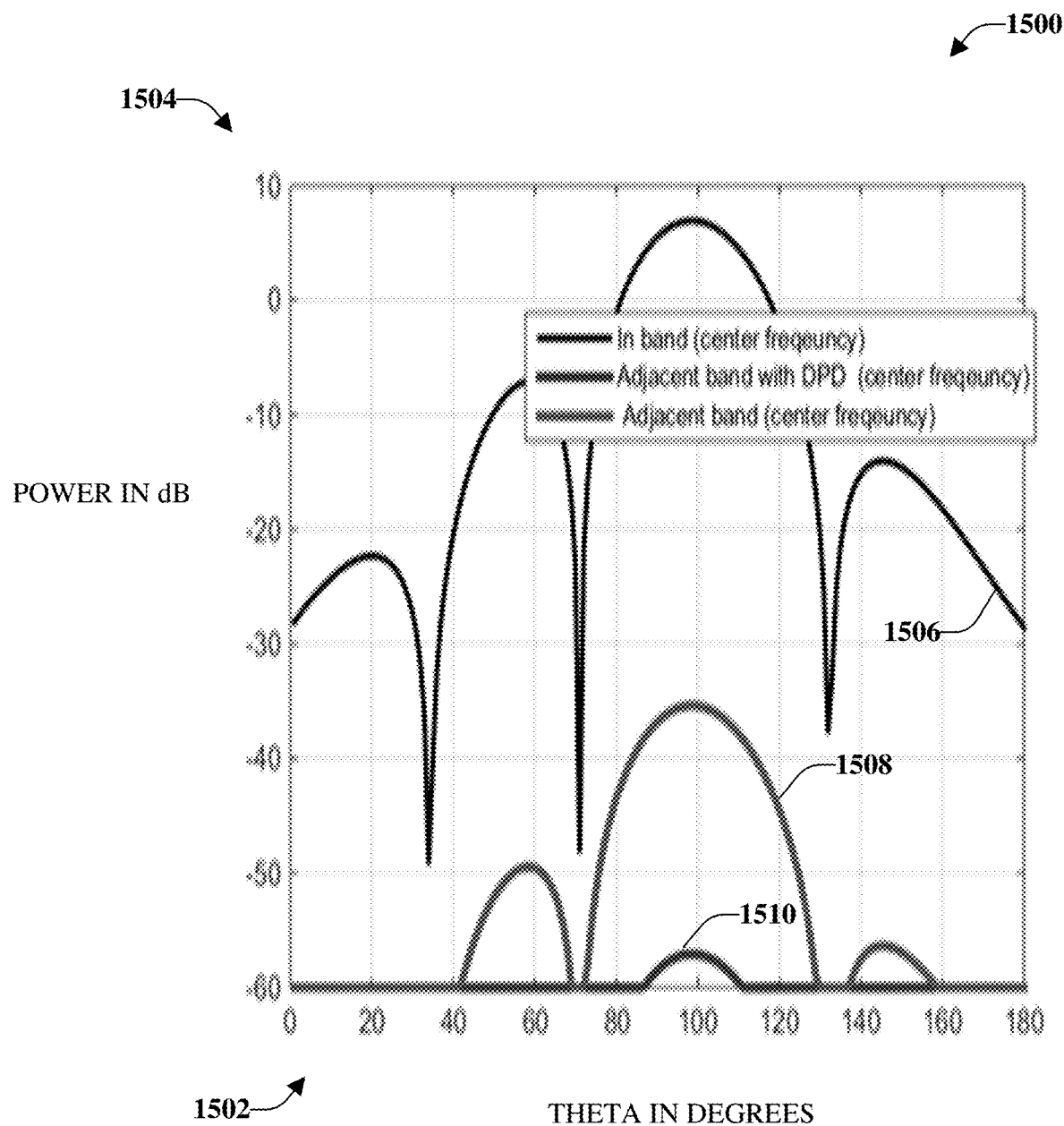
FIG. 15 illustrates an example, non-limiting, graph illustrating simulation results of power spectral density utilizing the disclosed aspects.

FIG. 15 illustrates an example, non-limiting, graph 1500 illustrating simulation results of PSD utilizing the disclosed aspects. The horizontal axis 1502 represents theta in degrees and the vertical axis 1504 represents power in dBs. The first line 1506 indicates in band (center frequency), the second line 1508 indicates adjacent band with DPD (center frequency), and the third line 1510 indicates adjacent band (center frequency).

For this example, ACLR_STD is set to −50 dBC, PEAK_AZIMUTH is set to −60 dBc, and PEAK_ELEVA- TION is set to −100 dBc. As illustrated by the graph 1500, emissions can be reduced in all directions with the disclosed aspects according to the simulation results.

Figure 16:
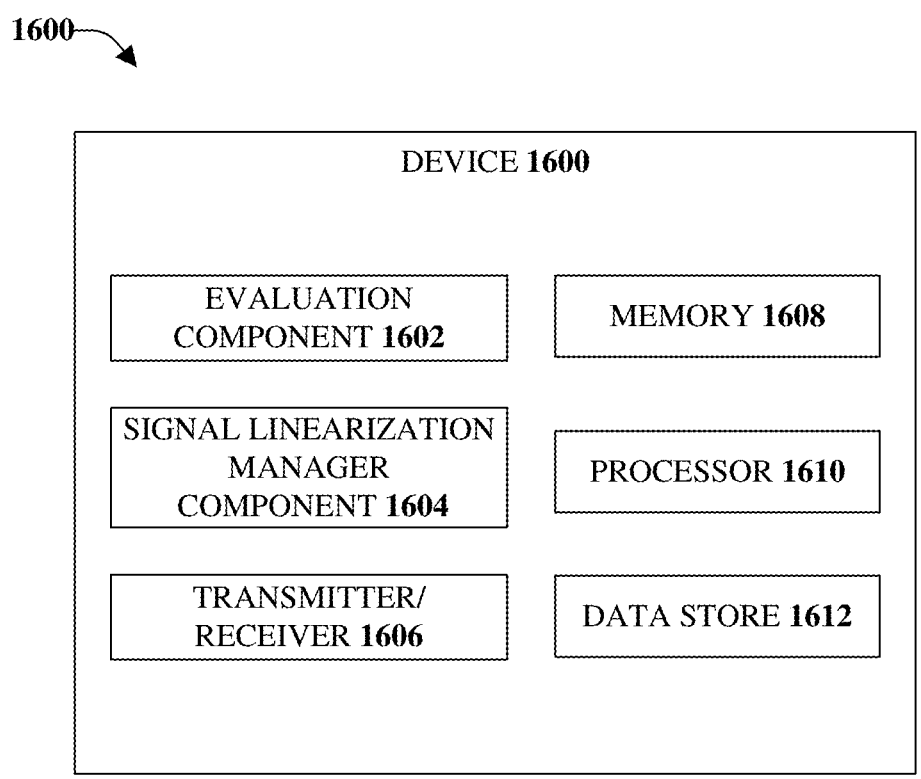
FIG. 16 illustrates an example, non-limiting, device for mitigating and/or reducing spatial emissions in advanced networks in accordance with one or more embodiments described herein.

FIG. 16 illustrates an example, non-limiting, device 1600 for mitigating and/or reducing spatial emissions in advanced networks in accordance with one or more embodiments described herein. Aspects of devices (e.g., the device 1600 and the like), apparatuses, systems, and/or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the device 1600 can be any type of component, machine, system, facility, apparatus, and/or instrument that comprises a processor and/or can be capable of effective and/or operative communication with a wired and/or wireless network. Components, machines, apparatuses, systems, facilities, and/or instrumentalities that can comprise the device 1600 can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

The device 1600 can be a communication device, such as a network device and can be included in a group of network devices of a wireless network. The device 1600 can include an evaluation component 1602, a signal linearization manager component 1604, a transmitter/receiver 1606, at least one memory 1608, at least one processor 1610, and at least one data store 1612.

The transmitter/receiver 1606 can obtain information about emissions of one or more antenna elements (e.g., a first antenna element, a second antenna element, and subsequent antenna elements) and/or groups of antenna elements. For example, groups of antenna elements can include one or more antenna elements. Further, two groups of antenna elements can include a same number of antenna elements and/or a different number of antenna elements.

The evaluation component 1602 can make a first determination whether an adjacent channel leakage ratio of a first output signal of the first power amplifier fails to satisfy a define output value. In an example, the defined output value can be a standard ACLR value (e.g., ACLR_STD). According to some implementations, the defined output value can be a fixed value. However, according to some implementations, the defined output value can be a configurable value.

The signal linearization manager component 1604 can be configured to apply a first signal linearization to a first output signal of a first power amplifier based on a determination by the evaluation component 1602 that the adjacent channel leakage ratio of the first output signal of the first power amplifier fails to satisfy the define output value. In an example, the first signal linearization can be based on a first pre-distortion signal. In an example, applying the first signal linearization can comprise a first application of a first pre-distortion signal to an input signal of the first power amplifier.

Upon or after the signal linearization manager component 1604 applies the first signal linearization, the evaluation component 1602 can re-evaluate the adjacent channel leakage ratio of the first output signal. If it is determined that the value continues to fail to satisfy the defined output value, the signal linearization manager component 1604 can apply the same signal linearization (e.g., the first signal linearization), or a different signal linearization, to the first output signal. This process can be repeated until the evaluation component 1602 determines that the adjacent channel leakage ratio of the first output signal satisfies the defined output value and the application of the first signal linearization can be discontinued.

Upon or after it is determined that the adjacent channel leakage ratio of the first output signal satisfies the defined output value, the evaluation component 1602 (or another evaluation component or another device component) can make a second determination whether a first power level in the channel frequency that is adjacent the first output signal is less than a defined threshold azimuth level. The defined threshold azimuth level can be a peak azimuth value (e.g., PEAK_AZIMUTH). In some implementations, the defined threshold azimuth level can be a fixed level (e.g., a fixed value). In other implementations, the defined threshold azimuth level can be a configurable level (e.g., a configurable value).

The signal linearization manager component 1604 can be configured to apply a second signal linearization to a group of output signals of a group of power amplifiers for a defined azimuth direction associated with channel frequencies of the group of output signals, based on a determination by the evaluation component 1602 that the first power level in the channel frequency that is adjacent the first output signal is not less than a defined threshold azimuth level. In an example, the second signal linearization can be based on a second pre-distortion signal. The second signal linearization (e.g., the second pre-distortion signal) can be different from the first signal linearization (e.g., the first pre-distortion signal). In an example, applying the second signal linearization can comprise a second application of a second pre-distortion signal to input signals of the group of power amplifiers.

Upon or after the signal linearization manager component 1604 applies the second signal linearization, the evaluation component 1602 can re-evaluate the first power level in the channel frequency that is adjacent the first output signal. If it is determined that the first power level continues to fail to satisfy the defined threshold azimuth level, the signal linearization manager component 1604 can apply the same signal linearization (e.g., the second signal linearization), or a different signal linearization, to the second output signal. This process can be repeated until the evaluation component 1602 determines that the first power level satisfies the defined threshold azimuth level and the application of the second signal linearization can be discontinued.

Upon or after it is determined that the first power level satisfies the defined threshold azimuth level, the evaluation component 1602 (or another evaluation component or another device component) can make a third determination whether a second power level in the channel frequency that is adjacent the first output signal is less than a defined threshold elevation level. The defined elevation level can be a peak elevation value (e.g., PEAK_ELEVATION). In some implementations, the defined elevation level can be a fixed level (e.g., a fixed value). In other implementations, the defined elevation level can be a configurable level (e.g., a configurable value).

The signal linearization manager component 1604 can be configured to apply a third signal linearization to a group of output signals of a group of power amplifiers for a defined elevation direction associated with channel frequencies of the group of output signals, based on a determination by the evaluation component 1602 that the second power level in the channel frequency that is adjacent the first output signal is not less than a defined threshold elevation level. In an example, the third signal linearization can be based on a third pre-distortion signal. The third signal linearization (e.g., the third pre-distortion signal) can be different from the first signal linearization (e.g., the first pre-distortion signal) and/or the second signal linearization (e.g., the second pre-distortion signal). In an example, applying the third signal linearization can comprise a third application of a third pre-distortion signal to input signals of the group of power amplifiers.

Upon or after the signal linearization manager component 1604 applies the third signal linearization, the evaluation component 1602 can re-evaluate the channel frequency that is adjacent the first output signal. If it is determined that the second power level continues to fail to satisfy the defined threshold elevation level, the signal linearization manager component 1604 can apply the same signal linearization (e.g., the third signal linearization), or a different signal linearization, to the second output signal. This process can be repeated until the evaluation component 1602 determines that the second power level satisfies the defined threshold elevation level and the application of the third signal linearization can be discontinued.

According to some implementations, reducing an effect of a radiation pattern associated with the first output signal to the group of output signals can be reduced. For example, the reduction of the effect can be based on applying the first signal linearization, the second signal linearization, and the third signal linearization. Further, the radiation pattern can be a function of the first output signal, an antenna element pattern in an azimuth domain, and the antenna element pattern in a vertical domain.

Accordingly, the device 1600 (as well as other embodiments discussed herein) can mitigate and/or reduce the spatial emissions such that the AAS systems can co-exist with other systems. As discussed herein, the device can linearize the power amplifier such that not only ACLR is reduced and/or mitigated, but also the spatial emissions in azimuth and elevation directions can be minimized and/or reduced by checking the radiation pattern.

Thus, as discussed herein, deployment of active antenna systems can be easy even in the presence of critical systems at adjacent frequencies for example machine type of communication systems. In addition, significant gains at system level as the emissions which are beam formed are reduced can be achieved. Further, benefits can include, but are not limited to, reduced and/or mitigated emission in all directions.

With continuing reference to FIG. 16, the transmitter/receiver 1606 can be configured to transmit to, and/or receive data from, other devices (e.g., network devices and/or other communication devices). Through the transmitter/receiver 1606, the device 1600 can concurrently transmit and receive data, can transmit and receive data at different times, or combinations thereof.

The at least one memory 1608 can be operatively connected to the at least one processor 1610. The at least one memory 1608 can store executable instructions that, when executed by the at least one processor 1610 can facilitate performance of operations. Further, the at least one processor 1610 can be utilized to execute computer executable components stored in the memories. For example, the at least one memory 1608 can store protocols associated with reducing and/or mitigating spatial emissions as discussed herein.

The at least one memory 1608 can store respective protocols associated with reducing and/or mitigating spatial emissions such that the device 1600 can employ stored protocols and/or algorithms to achieve improved communications in a wireless network as described herein. It should be appreciated that data stores (e.g., memories) components described herein can be either volatile memory or nonvolatile memory, or can include both volatile and nonvolatile memory. By way of example and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of example and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

The at least one processor 1610 can facilitate respective analysis of information related to reducing and/or mitigating spatial emissions in a communication network. The at least one processor 1610 can be a processor dedicated to analyzing and/or generating information received, a processor that controls one or more components of the device 1600, and/or a processor that both analyzes and generates information received and controls one or more components of the device 1600.

Further, the term network device (e.g., network node, network node device, radio network node) is used herein to refer to any type of network node serving communications devices and/or connected to other network nodes, network elements, or another network node (e.g., radio node) from which the communications devices can receive a radio signal. In cellular radio access networks (e.g., universal mobile telecommunications system (UMTS) networks or other networks), network devices can be referred to as base transceiver stations (BTS), radio base station, radio network nodes, base stations, NodeB, eNodeB (e.g., evolved NodeB), and so on. In 5G terminology, the network nodes can be referred to as gNodeB (e.g., gNB) devices. Network devices can also comprise multiple antennas for performing various transmission operations (e.g., Multiple Input Multiple Output (MIMO) operations). A network node can comprise a cabinet and other protected enclosures, an antenna mast, and actual antennas. Network devices can serve several cells, also called sectors, depending on the configuration and type of antenna. Examples of network nodes (e.g., network device) can include but are not limited to: NodeB devices, base station (BS) devices, access point (AP) devices, TRPs, and radio access network (RAN) devices. The network nodes can also include multi-standard radio (MSR) radio node devices, comprising: an MSR BS, an eNode B, a network controller, a radio network controller (RNC), a base station controller (BSC), a relay, a donor node controlling relay, a base transceiver station (BTS), a transmission point, a transmission node, an Remote Radio Unit (RRU), an Remote Radio Head (RRH), nodes in distributed antenna system (DAS), and the like.

Described herein are systems, methods, articles of manufacture, and other embodiments or implementations that can facilitate reduction and/or mitigation of spatial emissions in multi-antenna wireless communications systems, which can be advanced communications systems. Facilitating reduction and/or mitigate of spatial emissions in advanced networks can be implemented in connection with any type of device with a connection to the communications network (e.g., a mobile handset, a computer, a handheld device, etc.) any Internet of things (IoT) device (e.g., toaster, coffee maker, blinds, music players, speakers, etc.), and/or any connected vehicles (cars, airplanes, space rockets, and/or other at least partially automated vehicles (e.g., drones)). In some embodiments, the non-limiting term User Equipment (UE) is used. It can refer to any type of wireless device that communicates with a radio network node in a cellular or mobile communication system. Examples of UE are target device, device to device (D2D) UE, machine type UE or UE capable of machine to machine (M2M) communication, PDA, Tablet, mobile terminals, smart phone, Laptop Embedded Equipped (LEE), laptop mounted equipment (LME), USB dongles etc. Note that the terms element, elements and antenna ports can be interchangeably used but carry the same meaning in this disclosure. The embodiments are applicable to single carrier as well as to Multi-Carrier (MC) or Carrier Aggregation (CA) operation of the UE. The term Carrier Aggregation (CA) is also called (e.g., interchangeably called) "multi-carrier system," "multi-cell operation," "multi-carrier operation," "multi-carrier" transmission and/or reception.

In some embodiments, the non-limiting term radio network node or simply network node is used. It can refer to any type of network node that serves one or more UEs and/or that is coupled to other network nodes or network elements or any radio node from where the one or more UEs receive a signal. Examples of radio network nodes are Node B, Base Station (BS), Multi-Standard Radio (MSR) node such as MSR BS, eNode B, network controller, Radio Network Controller (RNC), Base Station Controller (BSC), relay, donor node controlling relay, Base Transceiver Station (BTS), Access Point (AP), transmission points, transmission nodes, RRU, RRH, nodes in Distributed Antenna System (DAS) etc.

Cloud Radio Access Networks (RAN) can enable the implementation of concepts such as Software-Defined Network (SDN) and Network Function Virtualization (NFV) in 5G networks. This disclosure can facilitate a generic channel state information framework design for a 5G network. Certain embodiments of this disclosure can comprise an SDN controller that can control routing of traffic within the network and between the network and traffic destinations. The SDN controller can be merged with the 5G network architecture to enable service deliveries via open Application Programming Interfaces (APIs) and move the network core towards an all Internet Protocol (IP), cloud based, and software driven telecommunications network. The SDN controller can work with, or take the place of, Policy and Charging Rules Function (PCRF) network elements so that policies such as quality of service and traffic management and routing can be synchronized and managed end to end.

Figure 17:
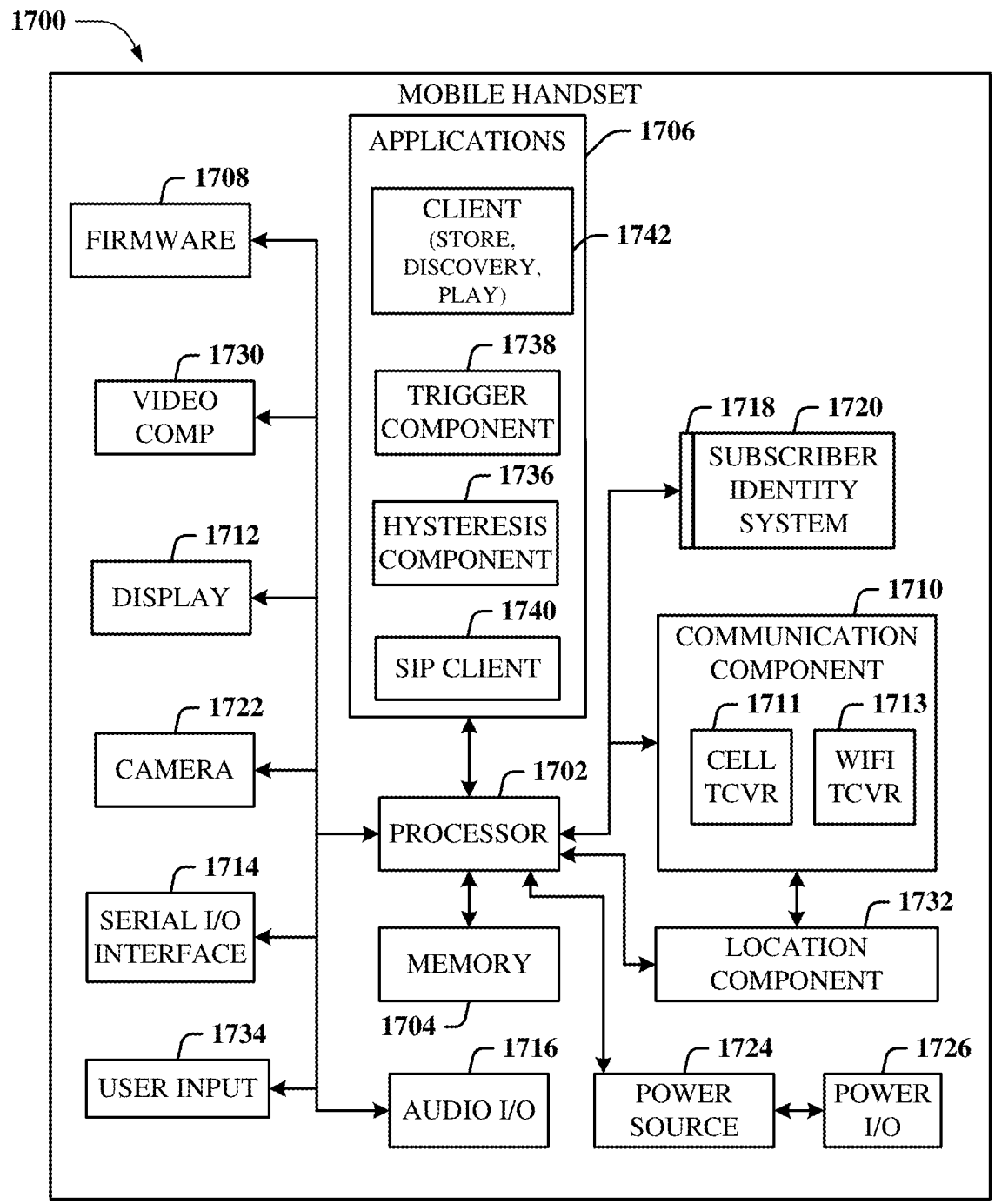
FIG. 17 illustrates an example block diagram of an example mobile handset operable to engage in a system architecture that facilitates wireless communications according to one or more embodiments described herein.

Referring now to FIG. 17, illustrated is an example block diagram of an example mobile handset 1700 operable to engage in a system architecture that facilitates wireless communications according to one or more embodiments described herein. Although a mobile handset is illustrated herein, it will be understood that other devices can be a mobile device, and that the mobile handset is merely illustrated to provide context for the embodiments of the various embodiments described herein. The following discussion is intended to provide a brief, general description of an example of a suitable environment in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules, or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules, or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset includes a processor 1702 for controlling and processing all onboard operations and functions. A memory 1704 interfaces to the processor 1702 for storage of data and one or more applications 1706 (e.g., a video player software, user feedback component software, etc.). Other applications can include voice recognition of predetermined voice commands that facilitate initiation of the user feedback signals. The applications 1706 can be stored in the memory 1704 and/or in a firmware 1708, and executed by the processor 1702 from either or both the memory 1704 or/and the firmware 1708. The firmware 1708 can also store startup code for execution in initializing the handset 1700. A communications component 1710 interfaces to the processor 1702 to facilitate wired/wireless communication with external systems, e.g., cellular networks, VoIP networks, and so on. Here, the communications component 1710 can also include a suitable cellular transceiver 1711 (e.g., a GSM transceiver) and/or an unlicensed transceiver 1713 (e.g., Wi-Fi, WiMax) for corresponding signal communications. The handset 1700 can be a device such as a cellular telephone, a PDA with mobile communications capabilities, and messaging-centric devices. The communications component 1710 also facilitates communications reception from terrestrial radio networks (e.g., broadcast), digital satellite radio networks, and Internet-based radio services networks.

The handset 1700 includes a display 1712 for displaying text, images, video, telephony functions (e.g., a Caller ID function), setup functions, and for user input. For example, the display 1712 can also be referred to as a "screen" that can accommodate the presentation of multimedia content (e.g., music metadata, messages, wallpaper, graphics, etc.). The display 1712 can also display videos and can facilitate the generation, editing and sharing of video quotes. A serial I/O interface 1714 is provided in communication with the processor 1702 to facilitate wired and/or wireless serial communications (e.g., USB, and/or IEEE 1394) through a hardwire connection, and other serial input devices (e.g., a keyboard, keypad, and mouse). This supports updating and troubleshooting the handset 1700, for example. Audio capabilities are provided with an audio I/O component 1716, which can include a speaker for the output of audio signals related to, for example, indication that the user pressed the proper key or key combination to initiate the user feedback signal. The audio I/O component 1716 also facilitates the input of audio signals through a microphone to record data and/or telephony voice data, and for inputting voice signals for telephone conversations.

The handset 1700 can include a slot interface 1718 for accommodating a SIC (Subscriber Identity Component) in the form factor of a card Subscriber Identity Module (SIM) or universal SIM 1720, and interfacing the SIM card 1720 with the processor 1702. However, it is to be appreciated that the SIM card 1720 can be manufactured into the handset 1700, and updated by downloading data and software.

The handset 1700 can process IP data traffic through the communications component 1710 to accommodate IP traffic from an IP network such as, for example, the Internet, a corporate intranet, a home network, a person area network, etc., through an ISP or broadband cable provider. Thus, VOID traffic can be utilized by the handset 1700 and IP-based multimedia content can be received in either an encoded or decoded format.

A video processing component 1722 (e.g., a camera) can be provided for decoding encoded multimedia content. The video processing component 1722 can aid in facilitating the generation, editing, and sharing of video quotes. The handset 1700 also includes a power source 1724 in the form of batteries and/or an AC power subsystem, which power source 1724 can interface to an external power system or charging equipment (not shown) by a power I/O component 1726.

The handset 1700 can also include a video component 1730 for processing video content received and, for recording and transmitting video content. For example, the video component 1730 can facilitate the generation, editing and sharing of video quotes. A location tracking component 1732 facilitates geographically locating the handset 1700. As described hereinabove, this can occur when the user initiates the feedback signal automatically or manually. A user input component 1734 facilitates the user initiating the quality feedback signal. The user input component 1734 can also facilitate the generation, editing and sharing of video quotes. The user input component 1734 can include such conventional input device technologies such as a keypad, keyboard, mouse, stylus pen, and/or touch screen, for example.

Referring again to the applications 1706, a hysteresis component 1736 facilitates the analysis and processing of hysteresis data, which is utilized to determine when to associate with the access point. A software trigger component 1738 can be provided that facilitates triggering of the hysteresis component 1736 when the Wi-Fi transceiver 1713 detects the beacon of the access point. A SIP client 1740 enables the handset 1700 to support SIP protocols and register the subscriber with the SIP registrar server. The applications 1706 can also include a client 1742 that provides at least the capability of discovery, play and store of multimedia content, for example, music.

The handset 1700, as indicated above related to the communications component 1710, includes an indoor network radio transceiver 1713 (e.g., Wi-Fi transceiver). This function supports the indoor radio link, such as IEEE 802.11, for the dual-mode GSM handset 1700. The handset 1700 can accommodate at least satellite radio services through a handset that can combine wireless voice and digital radio chipsets into a single handheld device.

Figure 18:
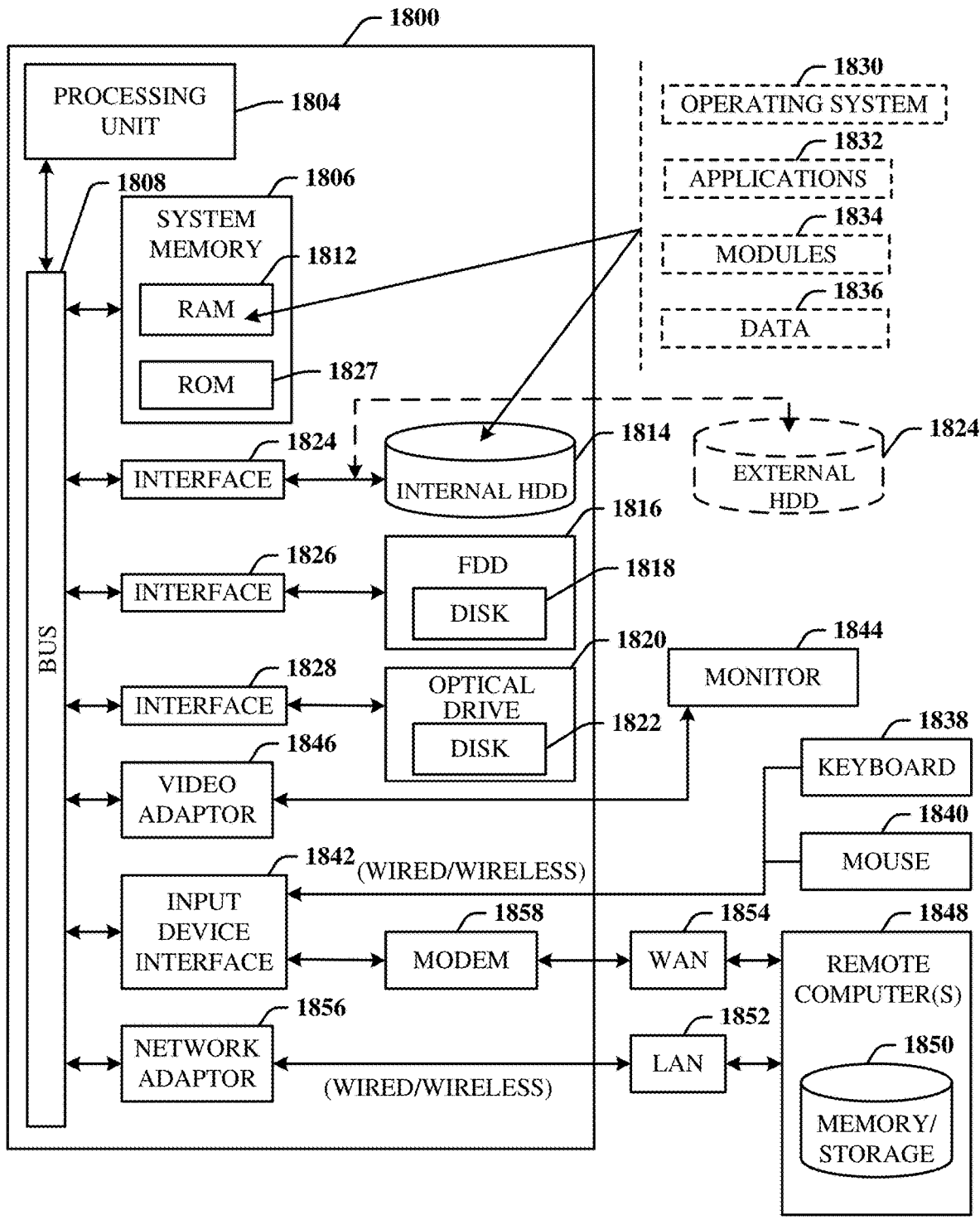
FIG. 18 illustrates an example block diagram of an example computer operable to engage in a system architecture that facilitates wireless communications according to one or more embodiments described herein.

Referring now to FIG. 18, illustrated is an example block diagram of an example computer 1800 operable to engage in a system architecture that facilitates wireless communications according to one or more embodiments described herein. The computer 1800 can provide networking and communication capabilities between a wired or wireless communication network and a server (e.g., Microsoft server) and/or communication device. In order to provide additional context for various aspects thereof, FIG. 18 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 18, implementing various aspects described herein with regards to the end-user device can include a computer 1800, the computer 1800 including a processing unit 1804, a system memory 1806 and a system bus 1808. The system bus 1808 couples system components including, but not limited to, the system memory 1806 to the processing unit 1804. The processing unit 1804 can be any of various commercially available processors. Dual microprocessors and other multi processor architectures can also be employed as the processing unit 1804.

The system bus 1808 can be any of several types of bus structure that can further interconnect to a memory bus (with or without a memory controller), a peripheral bus, and a local bus using any of a variety of commercially available bus architectures. The system memory 1806 includes read-only memory (ROM) 1827 and random access memory (RAM) 1812. A basic input/output system (BIOS) is stored in a non-volatile memory 1827 such as ROM, EPROM, EEPROM, which BIOS contains the basic routines that help to transfer information between elements within the computer 1800, such as during start-up. The RAM 1812 can also include a high-speed RAM such as static RAM for caching data.

The computer 1800 further includes an internal hard disk drive (HDD) 1814 (e.g., EIDE, SATA), which internal hard disk drive 1814 can also be configured for external use in a suitable chassis (not shown), a magnetic floppy disk drive (FDD) 1816, (e.g., to read from or write to a removable diskette 1818) and an optical disk drive 1820, (e.g., reading a CD-ROM disk 1822 or, to read from or write to other high capacity optical media such as the DVD). The hard disk drive 1814, magnetic disk drive 1816 and optical disk drive 1820 can be connected to the system bus 1808 by a hard disk drive interface 1824, a magnetic disk drive interface 1826 and an optical drive interface 1828, respectively. The interface 1824 for external drive implementations includes at least one or both of Universal Serial Bus (USB) and IEEE 1394 interface technologies. Other external drive connection technologies are within contemplation of the subject innovation.

The drives and their associated computer-readable media provide nonvolatile storage of data, data structures, computer-executable instructions, and so forth. For the computer 1800 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1800, such as zip drives, magnetic cassettes, flash memory cards, cartridges, and the like, can also be used in the exemplary operating environment, and further, that any such media can contain computer-executable instructions for performing the methods of the disclosed innovation.

A number of program modules can be stored in the drives and RAM 1812, including an operating system 1830, one or more application programs 1832, other program modules 1834 and program data 1836. All or portions of the operating system, applications, modules, and/or data can also be cached in the RAM 1812. It is to be appreciated that the innovation can be implemented with various commercially available operating systems or combinations of operating systems.

A user can enter commands and information into the computer 1800 through one or more wired/wireless input devices, e.g., a keyboard 1838 and a pointing device, such as a mouse 1840. Other input devices (not shown) can include a microphone, an IR remote control, a joystick, a game pad, a stylus pen, touch screen, or the like. These and other input devices are often connected to the processing unit 1804 through an input device interface 1842 that is coupled to the system bus 1808, but can be connected by other interfaces, such as a parallel port, an IEEE 1394 serial port, a game port, a USB port, an IR interface, etc.

A monitor 1844 or other type of display device is also connected to the system bus 1808 through an interface, such as a video adapter 1846. In addition to the monitor 1844, a computer 1800 typically includes other peripheral output devices (not shown), such as speakers, printers, etc.

The computer 1800 can operate in a networked environment using logical connections by wired and/or wireless communications to one or more remote computers, such as a remote computer(s) 1848. The remote computer(s) 1848 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1850 is illustrated. The logical connections depicted include wired/wireless connectivity to a local area network (LAN) 1852 and/or larger networks, e.g., a wide area network (WAN) 1854. Such LAN and WAN networking environments are commonplace in offices and companies, and facilitate enterprise-wide computer networks, such as intranets, all of which can connect to a global communications network, e.g., the Internet.

When used in a LAN networking environment, the computer 1800 is connected to the local network 1852 through a wired and/or wireless communication network interface or adapter 1856. The adapter 1856 can facilitate wired or wireless communication to the LAN 1852, which can also include a wireless access point disposed thereon for communicating with the wireless adapter 1856.

When used in a WAN networking environment, the computer 1800 can include a modem 1858, or is connected to a communications server on the WAN 1854, or has other means for establishing communications over the WAN 1854, such as by way of the Internet. The modem 1858, which can be internal or external and a wired or wireless device, is connected to the system bus 1808 through the input device interface 1842. In a networked environment, program modules depicted relative to the computer, or portions thereof, can be stored in the remote memory/storage device 1850. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

An aspect of 5G, which differentiates from previous 4G systems, is the use of NR. NR architecture can be designed to support multiple deployment cases for independent configuration of resources used for RACH procedures. Since the NR can provide additional services than those provided by LTE, efficiencies can be generated by leveraging the pros and cons of LTE and NR to facilitate the interplay between LTE and NR, as discussed herein.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

As used in this disclosure, in some embodiments, the terms "component," "system," "interface," and the like are intended to refer to, or comprise, a computer-related entity or an entity related to an operational apparatus with one or more specific functionalities, wherein the entity can be either hardware, a combination of hardware and software, software, or software in execution, and/or firmware. As an example, a component can be, but is not limited to being, a process running on a processor, a processor, an object, an executable, a thread of execution, computer-executable instructions, a program, and/or a computer. By way of illustration and not limitation, both an application running on a server and the server can be a component One or more components can reside within a process and/or thread of execution and a component can be localized on one computer and/or distributed between two or more computers. In addition, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software application or firmware application executed by one or more processors, wherein the processor can be internal or external to the apparatus and can execute at least a part of the software or firmware application. As yet another example, a component can be an apparatus that provides specific functionality through electronic components without mechanical parts, the electronic components can comprise a processor therein to execute software or firmware that confer(s) at least in part the functionality of the electronic components. In an aspect, a component can emulate an electronic component via a virtual machine, e.g., within a cloud computing system. While various components have been illustrated as separate components, it will be appreciated that multiple components can be implemented as a single component, or a single component can be implemented as multiple components, without departing from example embodiments In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "mobile device equipment," "mobile station," "mobile," subscriber station," "access terminal," "terminal," "handset," "communication device," "mobile device" (and/or terms representing similar terminology) can refer to a wireless device utilized by a subscriber or mobile device of a wireless communication service to receive or convey data, control, voice, video, sound, gaming or substantially any data-stream or signaling-stream. The foregoing terms are utilized interchangeably herein and with reference to the related drawings. Likewise, the terms "access point (AP)," "Base Station (BS)," BS transceiver, BS device, cell site, cell site device, "Node B (NB)," "evolved Node B (eNode B)," "home Node B (HNB)" and the like, are utilized interchangeably in the application, and refer to a wireless network component or appliance that transmits and/or receives data, control, voice, video, sound, gaming or substantially any data-stream or signaling-stream from one or more subscriber stations. Data and signaling streams can be packetized or frame-based flows.

Furthermore, the terms "device," "communication device," "mobile device," "subscriber," "customer entity," "consumer," "customer entity," "entity" and the like are employed interchangeably throughout, unless context warrants particular distinctions among the terms. It should be appreciated that such terms can refer to human entities or automated components supported through artificial intelligence (e.g., a capacity to make inference based on complex mathematical formalisms), which can provide simulated vision, sound recognition and so forth.

Embodiments described herein can be exploited in substantially any wireless communication technology, comprising, but not limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Z-Wave, Zigbee and other 802.XX wireless technologies and/or legacy telecommunication technologies.

Systems, methods and/or machine-readable storage media for facilitating a two-stage downlink control channel for 5G systems are provided herein. Legacy wireless systems such as LTE, Long-Term Evolution Advanced (LTE-A), High Speed Packet Access (HSPA) etc. use fixed modulation format for downlink control channels. Fixed modulation format implies that the downlink control channel format is always encoded with a single type of modulation (e.g., quadrature phase shift keying (QPSK)) and has a fixed code rate. Moreover, the forward error correction (FEC) encoder uses a single, fixed mother code rate of ⅓ with rate matching. This design does not take into the account channel statistics. For example, if the channel from the BS device to the mobile device is very good, the control channel cannot use this information to adjust the modulation, code rate, thereby unnecessarily allocating power on the control channel. Similarly, if the channel from the BS to the mobile device is poor, then there is a probability that the mobile device might not able to decode the information received with only the fixed modulation and code rate. As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
   facilitating, by a network device of a communications network and comprising a processor, a first application of a first pre-distortion signal to a first input signal of a first power amplifier based on a determination that a first output signal of the first power amplifier fails to satisfy a defined output value, wherein the first output signal comprises a first channel frequency;
   facilitating, by the network device, a second application of a second pre-distortion signal to a second input signal of a second power amplifier for a defined azimuth direction associated with a second channel frequency of a second output signal of the second power amplifier, wherein the second channel frequency is adjacent to the first channel frequency; and
   facilitating, by the network device, a third application of a third pre-distortion signal to the second input signal of the second power amplifier for a defined elevation direction associated with the second channel frequency of the second output signal.

2. The method of claim 1, further comprising mitigating, by the network device, a radiation pattern associated with the first output signal based on the facilitating the first application of the first pre-distortion signal, the facilitating the second application of the second pre-distortion signal, and the facilitating the third application of the third pre-distortion signal.

3. The method of claim 2, wherein the radiation pattern is a function of the first output signal, an antenna element pattern in an azimuth domain, and the antenna element pattern in a vertical domain.

4. The method of claim 1, wherein the method further comprises:
determining, by the network device, that a power level in the second channel frequency is less than a defined threshold azimuth level based on the facilitating the second application of the second pre-distortion signal; and
discontinuing, by the network device, the second application of the second pre-distortion signal.

5. The method of claim 1, wherein the method further comprises:
determining, by the network device, that a power level in the second channel frequency is less than a defined threshold elevation level based on the facilitating the third application of the third pre-distortion signal; and
discontinuing, by the network device, the third application of the third pre-distortion signal.

6. The method of claim 1, wherein the facilitating the second application of the second pre-distortion signal comprises applying the second pre-distortion signal to a third input signal of a third power amplifier for the defined azimuth direction, and wherein a third output signal of the third power amplifier comprises a third channel frequency that is adjacent to the first channel frequency of the first output signal.

7. The method of claim 1, wherein the facilitating the third application of the third pre-distortion signal comprises applying the third pre-distortion signal to a third input signal of a third power amplifier for the defined elevation direction, and wherein a third output signal of the third power amplifier comprises a third channel frequency that is adjacent to the first channel frequency of the first output signal.

8. The method of claim 1, wherein the first pre-distortion signal, the second pre-distortion signal, and the third pre-distortion signal are digital pre-distortion signals.

9. The method of claim 1, wherein the first pre-distortion signal, the second pre-distortion signal, and the third pre-distortion signal are analog pre-distortion signals.

10. The method of claim 1, wherein the first output signal and the second output signal are signals configured to operate according to a fifth generation wireless network communication protocol.

11. The method of claim 1, wherein the first output signal and the second output signal are signals configured to operate according to a sixth generation wireless network communication protocol.

12. A system, comprising:
a processor; and
a memory that stores executable instructions that, when executed by the processor, facilitate performance of operations, comprising:
applying a first signal linearization to a first output signal of a first power amplifier based on a determination that an adjacent channel leakage ratio of the first output signal of the first power amplifier fails to satisfy a defined output value;
applying a second signal linearization to a group of output signals of a group of power amplifiers for a defined azimuth direction associated with channel frequencies of the group of output signals, wherein the channel frequencies of the group of output signals are adjacent to a channel frequency of the first output signal; and
applying a third signal linearization to the group of output signals for a defined elevation direction associated with the channel frequencies of the group of output signals.

13. The system of claim 12, wherein the operations further comprise:
reducing an effect of a radiation pattern associated with the first output signal to the group of output signals, wherein the reducing the effect is based on the applying the first signal linearization, the second signal linearization, and the third signal linearization, and wherein the radiation pattern is a function of the first output signal, an antenna element pattern in an azimuth domain, and the antenna element pattern in a vertical domain.

14. The system of claim 12, wherein the operations further comprise:
discontinuing the first signal linearization based on a first determination that the adjacent channel leakage ratio of the first output signal of the first power amplifier satisfies the defined output value.

15. The system of claim 14, wherein the operations further comprise:
discontinuing the second signal linearization based on a second determination that a first power level in the channel frequency that is adjacent the first output signal is less than a defined threshold azimuth level.

16. The system of claim 15, wherein the operations further comprise:
discontinuing the third signal linearization based on a third determination that a second power level in the channel frequency that is adjacent to the first output signal is less than a defined threshold elevation level.

17. A non-transitory machine-readable medium, comprising executable instructions that, when executed by a processor, facilitate performance of operations, comprising:
implementing a first signal linearization to a first input signal of a first power amplifier based on a determination that a first output signal of the first power amplifier satisfies a defined output value, wherein the first output signal comprises a first channel frequency;
implementing a second signal linearization to a second input signal of a second power amplifier for a defined azimuth direction associated with a second channel frequency of a second output signal of the second power amplifier, wherein the second channel frequency is adjacent to the first channel frequency; and
implementing a third signal linearization to the second input signal of the second power amplifier for a defined elevation direction associated with the second channel frequency of the second output signal.

18. The non-transitory machine-readable medium of claim 17, wherein the operations further comprise:
determining that an adjacent channel leakage ratio of the first output signal of the first power amplifier satisfies the defined output value; and
discontinuing the implementing the first signal linearization.

19. The non-transitory machine-readable medium of claim 17, wherein the operations further comprise:

determining that a power level in the second channel frequency is less than a defined threshold elevation level based on the implementing the second signal linearization; and discontinuing the implementing the second signal linearization.

20. The non-transitory machine-readable medium of claim 17, wherein the operations further comprise:

determining that a power level in the second channel frequency is less than a defined threshold azimuth level based on the implementing the third signal linearization; and discontinuing the implementing the third signal linearization.

* * * * *